(12) United States Patent
Ma et al.

(10) Patent No.: US 12,298,475 B2
(45) Date of Patent: May 13, 2025

(54) COATING FOR A HEADS-UP DISPLAY WITH LOW VISIBLE LIGHT REFLECTANCE

(71) Applicant: Vitro Flat Glass LLC, Cheswick, PA (US)

(72) Inventors: Zhixun Ma, Pittsburgh, PA (US); Adam D. Polcyn, Pittsburgh, PA (US); Andrew Wagner, Pittsburgh, PA (US)

(73) Assignee: Vitro Flat Glass LLC, Cheswick, PA (US)

( * ) Notice: Subject to any disclaimer, the term of this patent is extended or adjusted under 35 U.S.C. 154(b) by 0 days.

(21) Appl. No.: 16/830,814

(22) Filed: Mar. 26, 2020

(65) Prior Publication Data

US 2020/0309997 A1     Oct. 1, 2020

Related U.S. Application Data

(60) Provisional application No. 62/976,645, filed on Feb. 14, 2020, provisional application No. 62/825,326, filed on Mar. 28, 2019.

(51) Int. Cl.
*B32B 15/04*     (2006.01)
*B32B 7/025*     (2019.01)
(Continued)

(52) U.S. Cl.
CPC .............. *G02B 1/116* (2013.01); *B32B 7/025* (2019.01); *B32B 17/10036* (2013.01);
(Continued)

(58) Field of Classification Search
CPC ................... B32B 17/10229; C03C 17/366
(Continued)

(56) References Cited

U.S. PATENT DOCUMENTS 3,762,988 A   10/1973  Clock et al.
4,287,107 A    9/1981  Hermann et al.
(Continued)

FOREIGN PATENT DOCUMENTS

CH    339575 A    6/1959
CN   1944545 A    4/2007
(Continued)

OTHER PUBLICATIONS

Han et al., "Improved conductivity and mechanism of carrier transport in zinc oxide with embedded silver layer" J. of Appl. Phys. 2008, pp. 1-9, vol. 103, No. 013708.
(Continued)

*Primary Examiner* — Lauren R Colgan
(74) *Attorney, Agent, or Firm* — The Webb Law Firm

(57) ABSTRACT

A coated article comprising includes a substrate comprising a first surface and second surface opposite the first surface and a coating applied over the surface. The coating includes: a first dielectric layer over at least a portion of the surface; a first metallic layer over at least a portion of the first dielectric layer; a second dielectric layer over at least a portion of the first metallic layer; a second metallic layer over at least a portion of the second dielectric layer; a third dielectric layer over at least a portion of the second metallic layer; a third metallic layer over at least a portion of the third dielectric layer; a fourth dielectric layer over at least a portion of the third metallic layer; an optional fourth metallic layer over at least a portion of the fourth dielectric layer; an optional fifth dielectric layer over at least a portion of the fourth metallic layer; and an outermost protective layer formed over at least a portion of the fourth or fifth dielectric layer. The coated article has a total combined thickness of the metallic layers is at least 10 nanometers, and no more than 60 nanometers.

18 Claims, 9 Drawing Sheets

(51) Int. Cl.
| | |
|---|---|
| *B32B 17/06* | (2006.01) |
| *B32B 17/10* | (2006.01) |
| *B60J 3/00* | (2006.01) |
| *B60K 35/00* | (2006.01) |
| *C03C 17/36* | (2006.01) |
| *C23C 14/00* | (2006.01) |
| *G02B 1/116* | (2015.01) |
| *G02B 5/28* | (2006.01) |
| *G02B 27/01* | (2006.01) |
| *H05B 3/84* | (2006.01) |
| *H05B 3/86* | (2006.01) |
| *B60K 35/23* | (2024.01) |
| *B60K 35/40* | (2024.01) |

(52) U.S. Cl.
CPC .. *B32B 17/10201* (2013.01); *B32B 17/10229* (2013.01); *B60J 3/007* (2013.01); *B60K 35/00* (2013.01); *C03C 17/3639* (2013.01); *C03C 17/3649* (2013.01); *C03C 17/366* (2013.01); *C23C 14/0036* (2013.01); *G02B 5/285* (2013.01); *G02B 27/0101* (2013.01); *H05B 3/84* (2013.01); *H05B 3/86* (2013.01); *B32B 2250/05* (2013.01); *B60K 35/23* (2024.01); *B60K 35/425* (2024.01); *C03C 2218/155* (2013.01); *G02B 2027/012* (2013.01); *H05B 2203/013* (2013.01)

(58) Field of Classification Search
USPC .................. 428/426, 428, 432, 434
See application file for complete search history.

(56) References Cited

U.S. PATENT DOCUMENTS

| | | | |
|---|---|---|---|
| 4,379,040 A | 4/1983 | Gillery | |
| 4,466,562 A | 8/1984 | DeTorre | |
| 4,606,800 A | 8/1986 | Hart et al. | |
| 4,610,771 A | 9/1986 | Gillery | |
| 4,671,155 A | 6/1987 | Goldinger | |
| 4,716,086 A | 12/1987 | Gillery et al. | |
| 4,746,347 A | 5/1988 | Sensi | |
| 4,792,536 A | 12/1988 | Pecoraro et al. | |
| 4,806,220 A | 2/1989 | Finley | |
| 4,834,857 A | 5/1989 | Gillery | |
| 4,861,669 A | 8/1989 | Gillery | |
| 4,898,789 A | 2/1990 | Finley | |
| 4,898,790 A | 2/1990 | Finley | |
| 4,900,633 A | 2/1990 | Gillery | |
| 4,902,580 A | 2/1990 | Gillery | |
| 4,902,581 A | 2/1990 | Criss | |
| 4,920,006 A | 4/1990 | Gillery | |
| 4,938,857 A | 7/1990 | Gillery | |
| 4,948,677 A | 8/1990 | Gillery | |
| 5,028,759 A | 7/1991 | Finley | |
| 5,030,593 A | 7/1991 | Heithoff | |
| 5,030,594 A | 7/1991 | Heithoff | |
| 5,059,295 A | 10/1991 | Finley | |
| 5,112,693 A | 5/1992 | Gillery | |
| 5,240,886 A | 8/1993 | Gulotta et al. | |
| 5,328,768 A | 7/1994 | Goodwin | |
| 5,385,872 A | 1/1995 | Gulotta et al. | |
| 5,393,593 A | 2/1995 | Gulotta et al. | |
| 5,492,750 A | 2/1996 | Shumaker, Jr. et al. | |
| 5,619,059 A | 4/1997 | Li et al. | |
| 5,653,903 A | 8/1997 | Pinchok, Jr. et al. | |
| 5,792,559 A | 8/1998 | Heithoff et al. | |
| 5,796,055 A | 8/1998 | Benson, Jr. et al. | |
| 5,821,001 A | 10/1998 | Arbab et al. | |
| 5,923,471 A | 7/1999 | Wood, II et al. | |
| 6,164,777 A | 12/2000 | Li et al. | |
| 6,495,251 B1 | 12/2002 | Arbab et al. | |
| 6,838,181 B1 | 1/2005 | Degand | |
| 7,537,677 B2 | 5/2009 | Lu et al. | |
| 7,588,829 B2 | 9/2009 | Finley et al. | |
| 8,003,235 B2 | 8/2011 | Gagliardi et al. | |
| 8,025,957 B2 * | 9/2011 | Thiel | C03C 17/36 |
| | | | 359/360 |
| 8,203,073 B2 | 6/2012 | Lu et al. | |
| 8,221,833 B2 | 7/2012 | Veerasamy et al. | |
| 8,420,162 B2 | 4/2013 | Blacker et al. | |
| 8,440,037 B2 | 5/2013 | Dietrich et al. | |
| 8,440,310 B2 | 5/2013 | Ferreira et al. | |
| 8,497,014 B2 | 7/2013 | Unquera et al. | |
| 8,686,319 B2 | 4/2014 | Thiel | |
| 8,722,210 B2 | 5/2014 | Jun et al. | |
| 8,974,864 B2 | 3/2015 | Finley et al. | |
| 9,003,697 B2 | 4/2015 | Giesen et al. | |
| 9,012,044 B2 | 4/2015 | Bright | |
| 9,028,930 B2 * | 5/2015 | Reymond | C03C 17/366 |
| | | | 428/34 |
| 9,034,459 B2 | 5/2015 | Condo et al. | |
| 9,062,366 B2 | 6/2015 | An et al. | |
| 9,067,822 B2 | 6/2015 | Maschwitz et al. | |
| 9,126,861 B2 | 9/2015 | Hashizume et al. | |
| 9,140,832 B2 | 9/2015 | Medwick et al. | |
| 9,199,874 B2 | 12/2015 | Peter et al. | |
| 9,296,649 B2 | 3/2016 | Okawa et al. | |
| 9,449,899 B2 | 9/2016 | Briere et al. | |
| 9,556,068 B2 | 1/2017 | Buhay et al. | |
| 9,599,752 B2 | 3/2017 | Laurent et al. | |
| 9,606,272 B2 | 3/2017 | Sandre-Chardonnal | |
| 9,630,875 B2 | 4/2017 | McSporran et al. | |
| 9,709,717 B2 | 7/2017 | Hevesi et al. | |
| 9,738,561 B2 | 8/2017 | Butz et al. | |
| 9,758,426 B2 | 9/2017 | Kabagambe et al. | |
| 9,776,915 B2 | 10/2017 | Wuillaume et al. | |
| 9,822,033 B2 | 11/2017 | Imran et al. | |
| 9,919,960 B2 * | 3/2018 | Mahieu | C03C 17/3644 |
| 9,950,951 B2 | 4/2018 | Sternchuss et al. | |
| 9,971,194 B2 | 5/2018 | Brecht et al. | |
| 10,040,719 B2 | 8/2018 | Eby et al. | |
| 10,078,409 B2 | 9/2018 | Veerasamy et al. | |
| 10,099,958 B2 | 10/2018 | Brossard et al. | |
| 10,294,149 B2 | 5/2019 | Wagner et al. | |
| 10,345,499 B2 * | 7/2019 | Medwick | C03C 17/366 |
| 10,358,384 B2 * | 7/2019 | Polcyn | C03C 17/36 |
| 10,453,580 B1 | 10/2019 | Wilson et al. | |
| 10,472,881 B2 | 11/2019 | Kuhn et al. | |
| 10,479,724 B2 * | 11/2019 | Ganjoo | C23C 28/322 |
| 10,502,878 B2 | 12/2019 | Ding et al. | |
| 10,539,726 B2 * | 1/2020 | Wagner | C03C 17/3681 |
| 10,562,813 B2 | 2/2020 | Roquiny et al. | |
| 10,597,324 B2 | 3/2020 | Miki Yoshida et al. | |
| 10,618,252 B2 | 4/2020 | Wagner et al. | |
| 10,654,747 B2 * | 5/2020 | Polcyn | C03C 17/3639 |
| 10,654,749 B2 * | 5/2020 | Polcyn | C03C 17/3639 |
| 11,078,718 B2 * | 8/2021 | Fisher | C03C 17/366 |
| 11,402,557 B2 | 8/2022 | Wagner et al. | |
| 12,060,751 B2 | 8/2024 | Paul et al. | |
| 2002/0119337 A1 | 8/2002 | Maze et al. | |
| 2002/0172775 A1 | 11/2002 | Buhay et al. | |
| 2003/0031842 A1 | 2/2003 | Marietti et al. | |
| 2003/0180547 A1 * | 9/2003 | Buhay | C03C 17/3613 |
| | | | 428/434 |
| 2003/0228476 A1 | 12/2003 | Buhay et al. | |
| 2003/0228484 A1 | 12/2003 | Finley et al. | |
| 2004/0023038 A1 | 2/2004 | Buhay et al. | |
| 2004/0023080 A1 | 2/2004 | Buhay et al. | |
| 2004/0106017 A1 | 6/2004 | Buhay et al. | |
| 2005/0095449 A1 | 5/2005 | Yanagisawa et al. | |
| 2005/0123772 A1 * | 6/2005 | Coustet | C03C 17/3652 |
| | | | 428/432 |
| 2005/0258030 A1 | 11/2005 | Finley et al. | |
| 2007/0020465 A1 * | 1/2007 | Thiel | C03C 17/3673 |
| | | | 428/428 |
| 2007/0082219 A1 * | 4/2007 | Fleury | B32B 17/10018 |
| | | | 428/656 |
| 2007/0224432 A1 * | 9/2007 | Morimoto | H05K 9/0096 |
| | | | 428/469 |

(56) References Cited

U.S. PATENT DOCUMENTS

| | | | |
|---|---|---|---|
| 2008/0174872 A1* | 7/2008 | Morimoto | G02B 1/16 |
| | | | 359/585 |
| 2008/0187692 A1 | 8/2008 | Roquiny et al. | |
| 2008/0311389 A1* | 12/2008 | Roquiny | C03C 17/3681 |
| | | | 428/336 |
| 2009/0015909 A1 | 1/2009 | Fleury et al. | |
| 2009/0047466 A1 | 2/2009 | German et al. | |
| 2009/0176086 A1* | 7/2009 | Martin | C03C 17/3618 |
| | | | 204/192.27 |
| 2011/0236663 A1* | 9/2011 | Fleury | B32B 17/10174 |
| | | | 428/428 |
| 2011/0236715 A1* | 9/2011 | Polcyn | C03C 17/366 |
| | | | 428/209 |
| 2011/0262726 A1* | 10/2011 | Knoll | C03C 17/3636 |
| | | | 428/428 |
| 2011/0268941 A1* | 11/2011 | Fischer | G02B 5/282 |
| | | | 204/192.1 |
| 2012/0087005 A1* | 4/2012 | Reymond | C03C 17/3626 |
| | | | 359/360 |
| 2012/0177900 A1 | 7/2012 | Laurent et al. | |
| 2013/0057951 A1* | 3/2013 | Hevesi | G02B 5/0858 |
| | | | 359/359 |
| 2013/0059137 A1 | 3/2013 | Hevesi et al. | |
| 2014/0072784 A1* | 3/2014 | Dietrich | C03C 17/3639 |
| | | | 428/428 |
| 2014/0193616 A1* | 7/2014 | Polcyn | C03C 17/3618 |
| | | | 428/201 |
| 2014/0272353 A1 | 9/2014 | Ding et al. | |
| 2014/0272453 A1* | 9/2014 | Polcyn | C03C 17/36 |
| | | | 428/622 |
| 2015/0004383 A1 | 1/2015 | Sandre-Chardonnal | |
| 2015/0125635 A1 | 5/2015 | O'Connor et al. | |
| 2016/0031750 A1* | 2/2016 | Ridealgh | C03C 17/3644 |
| | | | 428/428 |
| 2016/0077320 A1 | 3/2016 | Okada et al. | |
| 2016/0122236 A1 | 5/2016 | Mahieu et al. | |
| 2016/0223729 A1* | 8/2016 | Medwick | C03C 17/3644 |
| 2016/0244361 A1 | 8/2016 | Rondeau et al. | |
| 2017/0059753 A1* | 3/2017 | Wagner | C03C 17/366 |
| 2017/0144927 A1* | 5/2017 | Caillet | C03C 17/366 |
| 2017/0144928 A1* | 5/2017 | Caillet | C03C 17/3639 |
| 2017/0183255 A1 | 6/2017 | Walther et al. | |
| 2017/0198518 A1* | 7/2017 | Caillet | C03C 17/36 |
| 2017/0341977 A1* | 11/2017 | Polcyn | C03C 17/366 |
| 2018/0029930 A1* | 2/2018 | Lorenzzi | C03C 17/3639 |
| 2018/0194677 A1 | 7/2018 | Lorenzzi et al. | |
| 2018/0208503 A1 | 7/2018 | Hagen et al. | |
| 2018/0244567 A1 | 8/2018 | Singh et al. | |
| 2018/0291499 A1 | 10/2018 | Koch | |
| 2018/0323401 A1 | 11/2018 | Sato et al. | |
| 2019/0039947 A1 | 2/2019 | Fisher et al. | |
| 2019/0055157 A1 | 2/2019 | Hagen et al. | |
| 2019/0064516 A1 | 2/2019 | Wagner et al. | |
| 2019/0242178 A1* | 8/2019 | Fisher | C03C 17/366 |
| 2019/0330101 A1 | 10/2019 | Cid Aguilar et al. | |
| 2019/0352224 A1 | 11/2019 | You et al. | |
| 2020/0009836 A1 | 1/2020 | Braley | |
| 2020/0055285 A1 | 2/2020 | Compoint et al. | |
| 2020/0085170 A1 | 3/2020 | Yang et al. | |
| 2020/0096687 A1* | 3/2020 | Ma | C09D 7/61 |
| 2020/0101700 A1 | 4/2020 | Lee et al. | |
| 2020/0165163 A1 | 5/2020 | Mizutani et al. | |
| 2020/0310014 A1 | 10/2020 | Bard et al. | |
| 2020/0359467 A1 | 11/2020 | Farreyrol et al. | |
| 2021/0017811 A1 | 1/2021 | Han | |
| 2021/0053869 A1 | 2/2021 | Dehner et al. | |
| 2021/0122670 A1 | 4/2021 | Misra et al. | |
| 2022/0119305 A1* | 4/2022 | Fisher | C03C 17/36 |

FOREIGN PATENT DOCUMENTS

| | | |
|---|---|---|
| DE | 102014002965 A1 | 2/2015 |
| JP | H10182192 A | 7/1998 |
| JP | 2016540723 A | 12/2016 |
| WO | 0037384 A1 | 6/2000 |
| WO | 2015101744 A1 | 7/2015 |
| WO | 20180480038 A1 | 3/2018 |
| WO | 2018117801 A1 | 6/2018 |
| WO | 2018160616 A2 | 9/2018 |
| WO | 2019004199 A1 | 1/2019 |
| WO | 2019053741 A1 | 3/2019 |
| WO | 2019074901 A1 | 4/2019 |
| WO | 2019120849 A1 | 6/2019 |
| WO | 2019120850 A1 | 6/2019 |
| WO | 2019143597 A1 | 7/2019 |
| WO | 2019145256 A1 | 8/2019 |
| WO | 2019151431 A1 | 8/2019 |
| WO | 2019190419 A2 | 10/2019 |
| WO | 2019190420 A2 | 10/2019 |
| WO | 2019207241 A1 | 10/2019 |
| WO | 2019216661 A1 | 11/2019 |
| WO | 2020058061 A1 | 3/2020 |

OTHER PUBLICATIONS

Liu et al., "A new method for fabricating ultrathin metal films as scratch-resistant flexible transparent electrodes". Journal of Materiomics, 2015, pp. 52-59, vol. 1, No. (1).

Sharma et al., "High-performance radiation stable ZnO/Ag/ZnO multilayer transparent conductive electrode" Solar Energy Materials and Solar Cells, 2017, pp. 122-131, vol. 169.

Zhang et al., "Effects of Nb Surface and Ti Interface Layers on Thermal Stability and Electrical Resistivity of Ag Thin Films", Jpn. J. Appl. Phys., 2012, pp. 1-7, vol. 51.

Zhang et al., "Optimization of Surface Layers for Suppression of Agglomeration in Ag Films" Jpn. J. Appl. Phys., 2013, pp. 1-13, vol. 52, No. 7.

Gu et al., "Ultrasmooth and Thermally Stable Silver-Based Thin Films with Subnanometer Roughness by Aluminum Doping", ACSNANO, 2014, pp. 10343-10351, vol. 8:10.

Kawamura et al., "Thermally stable very thin Ag films for electrodes", J. Vac. Sci. Technol. A., 2009, pp. 975-978, vol. 27:4.

Ries, "Silver thin films: Improving the efficiency of low-E coatings by employing different seed layers", 2015, pp. 1-199.

Technical Information: What you need to know to Build With Light®, Guardian Glass LLC, 2019, pp. 1-36.

* cited by examiner

COATING FOR A HEADS-UP DISPLAY WITH LOW VISIBLE LIGHT REFLECTANCE

CROSS REFERENCE TO RELATED APPLICATIONS

The present application is entitled to and claims priority to U.S. Provisional Application No. 62/976,645 filed Feb. 14, 2020 and U.S. Provisional Application No. 62/825,326 filed Mar. 28, 2019, the disclosures of which are incorporated by reference.

BACKGROUND OF THE INVENTION

Field of the Invention

The invention relates generally to vehicle transparencies, such as vehicle windshields, and in one particular embodiment, to a heads-up display.

Technical Considerations

Conventional automotive heads-up displays (HUDs) use an electromagnetic radiation source in the dashboard that projects light up onto the windshield, which is then reflected to the driver's eyes, creating a virtual image of vehicle data so that the driver has access to information about the vehicle's operation without having to look away from the road. For electromagnetic radiation reflecting off of the windshield at angles typically found in a conventional vehicle, and a typical unpolarized light source, such as a light emitting diode (LED), the reflected light primarily is s-polarized, with a much smaller component of the light being p-polarized. In the extreme case, if the angle of incidence of the electromagnetic radiation to the windshield is the Brewster's angle of an air to glass interface (approximately 57°), the p-polarized reflectance is zero percent.

Light from the radiation source (primarily s-polarized) will reflect off of both the innermost surface of the windshield and the outermost surface of the windshield due to the refractive index mismatch between air and glass. This leads to two reflected images being formed, one from each surface. Multiple images formed in a HUD is a phenomenon referred to as "ghosting", and eliminating or minimizing the presence of "ghosts" is a goal of HUD technology. A conventional method of resolving ghosting is by employing a wedge-shaped vinyl layer between the inner and outer glass plies of the windshield to adjust the geometry of the two glass plies to align the two reflected images. This wedge-shaped vinyl increases the cost of the windshield and also increases the complexity of manufacturing the windshield.

It is also desirable to apply a coating to at least one of the glass plies to provide solar control, heating, and/or antenna functionality to the windshield. This additional coating leads to a third refractive index mismatch within the windshield, which leads to a third reflection, and a third reflected image on the HUD system, which is difficult to be compensated for by the wedge-shaped vinyl layer.

Therefore, there is a need in the art for a system and/or components to reduce or eliminate one or more of these problems. For example, it would be desirable to provide a HUD system that projects an image viewable to drivers that reduces or eliminates ghosting while improving solar performance and lowering energy.

SUMMARY OF THE INVENTION

The invention relates to a coated article. The coated article has a substrate having a first surface and a second surface opposite the first surface and a functional coating over the substrate. The coating has a first dielectric layer positioned over a least a portion of the surface. A first metallic layer is positioned over at least a portion of the first dielectric layer. Optionally, a first primer layer is positioned over at least a portion of the first metallic layer. A second dielectric layer is positioned over at least a portion of the first metallic layer or the optional first primer layer. A second metallic layer is positioned over at least a portion of the first metallic layer or optional first primer layer. Optionally, a second primer layer is positioned over at least a portion of the second metallic layer. A third dielectric layer is positioned over at least a portion of the second metallic layer or optional second primer layer. A third metallic layer is positioned over at least a portion of the third dielectric layer. Optionally, a third primer layer is positioned over at least a portion of the third metallic layer. A fourth dielectric layer is positioned over at least a portion of the third metallic layer or optional third primer layer. An optional outermost protective coating is formed over at least a portion of the fourth dielectric layer or over the functional coating. The coated article has a total combined thickness of the metallic layers of at least 10 nanometers to 60 nanometers.

The invention relates to a coated article. The coated article has a substrate having a first surface and a second surface opposite the first surface and a functional coating over the substrate. The coating has a first dielectric layer positioned over a least a portion of the surface. A first metallic layer is positioned over at least a portion of the first dielectric layer. Optionally, a first primer layer is positioned over at least a portion of the first metallic layer. A second dielectric layer is positioned over at least a portion of the first metallic layer or the optional first primer layer. A second metallic layer is positioned over at least a portion of the first metallic layer or optional first primer layer. Optionally, a second primer layer is positioned over at least a portion of the second metallic layer. A third dielectric layer is positioned over at least a portion of the second metallic layer or optional second primer layer. A third metallic layer is positioned over at least a portion of the third dielectric layer. Optionally, a third primer layer is positioned over at least a portion of the third metallic layer. A fourth dielectric layer is positioned over at least a portion of the third metallic layer or optional third primer layer. A fourth metallic layer is positioned over at least a portion of the fourth dielectric layer. An optional fourth primer layer is positioned over at least a portion of the fourth metallic layer. A fifth dielectric layer is positioned over at least a portion of the fourth metallic layer or optional fourth primer layer. An optional outermost protective coating is formed over at least a portion of the fifth dielectric layer or over the functional coating. The coated article has a total combined thickness of the metallic layers of at least 10 nanometers to 60 nanometers.

The invention relates to a method of making a coated article. A substrate having a first surface and second surface opposite the first surface is provided. A functional coating is applied over at least a portion of the surface. A first dielectric layer is formed over at least a portion of the surface. A first metallic layer is formed over at least a portion of the first dielectric layer. Optionally, a first primer layer is formed over at least a portion of the first metallic layer. A second dielectric layer is formed over at least a portion of the first metallic layer. A second metallic layer is formed over at least a portion of the second dielectric layer. Optionally, a second primer layer is formed over at least a portion of the second metallic layer. A third dielectric layer is formed over at least a portion of the second metallic layer. A third metallic layer is formed over at least a portion of the third dielectric layer. Optionally, a third primer layer is formed over at least a portion of the third metallic layer. A fourth dielectric layer is formed over at least a portion of the third metallic layer. An optional outermost protective coating is formed over at least a portion of the fourth dielectric layer or over the functional coating. The coated article has a total combined thickness of the metallic layers of at least 10 nanometers to than 60 nanometers.

BRIEF DESCRIPTION OF THE DRAWINGS

The invention will be described with reference to the following drawing figures wherein like reference numbers, identify like parts throughout.

DESCRIPTION OF THE INVENTION

Figure 1:
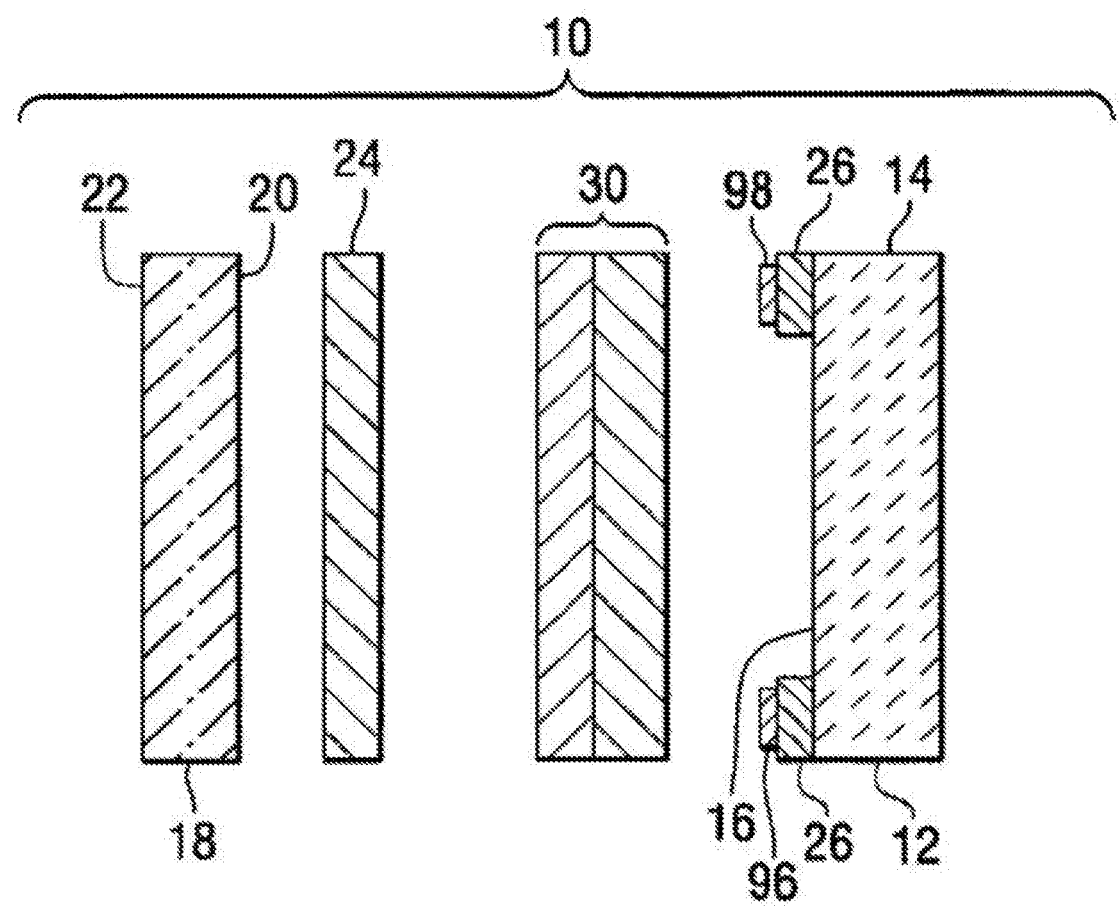
FIG. 1 is a schematic view (not to scale) of a non-limiting windshield.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about." Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in the light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g. 1 to 3.3, 4.7 to 7.5, 5.5 to 10, and the like. Further, as used herein, the terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nanometers (nm) to 800 nm. The terms "infrared region" or "infrared radiation" refer to electromagnetic radiation having a wavelength in the range of greater than 800 nm to 100,000 nm. The terms "ultraviolet region" or "ultraviolet radiation" mean electromagnetic energy having a wavelength in the range of 300 nm to less than 380 nm. Visible (luminous) transmittance (LTA) values (Y, x, y) herein are those determinable using C.I.E. (1976) standard illuminant "A" with a 2 degree observer (in conformance with U.S. Federal standards) over the wavelength range of 380 nm to 770 nm using a Lambda 9 spectrophotometer commercially available from Perkin-Elmer or TCS spectrophotometer commercially available from BYK-Gardner. Reflected color values L*, a*, b* (whether R1 or R2) were determined using an illuminant "D65" with a 10° observer (as is conventional in the automotive field).

As used herein, the term "film" refers to a coating region of a desired or selected coating composition. A "layer" can comprise one or more "films", and a "coating" or "coating stack" can comprise one or more "layers". The terms "metal" and "metal oxide" include silicon and silica, respectively, as well as traditionally recognized metals and metal oxides, even though silicon conventionally may not be considered a metal. Thickness values, unless indicated to the contrary, are geometric thickness values. Additionally, all documents, such as, but not limited to issued patents and patent applications, referred to herein, are to be considered "incorporated by reference" in their entirety.

The discussion of the invention may describe certain features as being "particularly" or "preferably" within certain limitations (e.g. "preferably", "more preferably", or "most preferably", within certain limitations). It is to be understood that the invention is not limited to these particular or preferred limitations but encompasses the entire scope of the disclosure.

A non-limiting transparency 10 (e.g., automotive windshield) incorporating features of the invention is illustrated in FIG. 1. The transparency 10 can have any desired visible light, infrared radiation, or ultraviolet radiation transmission and reflection properties. For example, the transparency 10 can have a visible light transmission of any desired amount, e.g. greater than 0% to 100%, greater than 70%. For windshield and front sidelight areas in the United States, the visible light transmission is typically greater than or equal to 70%. For privacy areas, such as rear seat sidelights and rear windows, the visible light transmission can be less than that for windshields, such as less than 70%.

As seen in FIG. 1, the transparency 10 includes a first ply or first substrate 12 with a first major surface facing the vehicle exterior, i.e. an outer major surface 14 (No. 1 surface) and an opposed second or inner major surface 16 (No. 2 surface). The transparency 10 also includes a second ply or second substrate 18 having an outer (first) major surface 22 (No. 4 surface) and an inner (second) major surface 20 (No. 3 surface). This numbering of the ply surfaces is in keeping with conventional practice in the automotive art. The first and second plies 12, 18 can be bonded together in any suitable manner, such as by conventional interlayer 24. Although not required, a conventional edge sealant can be applied to the perimeter of the laminated transparency 10 during and/or after lamination in any desired manner. A decorative band, e.g., an opaque, translucent, or colored shade band 26, such as a ceramic band, can be provided on a surface of at least one of plies 12, 18, for example around the perimeter of the inner major surface 16 of the first ply 12. A coating 30 is formed over at least a portion of one of the plies 12, 18, such as over the No. 2 surface 16 or No. 3 surface 20.

In the non-limiting embodiment illustrated in FIG. 1, the bus bar assembly includes a first or bottom bus bar 96 and a second or top bus bar 98 formed on the inner surface 16 of the outer ply 12 and separated by a bus bar to bus bar distance D. The bus bars 96, 98 are in electrical contact with the coating 30. In one non-limiting embodiment of the invention the bus bars 96, 98 can be positioned at least partially on, or completely on, the decorative band 26, as shown in FIG. 1.

In the broad practice of the invention, the plies 12, 18 of the transparency 10 can be of the same or different materials. The plies 12, 18 can include any desired material having any desired characteristics. For example, one or more of the plies 12, 18 can be transparent or translucent to visible light. By "transparent" is meant having visible light transmittance of greater than 0% to 100%. Alternatively, one or more plies 12, 18 can be translucent. By "translucent" is meant allowing electromagnetic energy (e.g., visible light) to pass through but diffusing this energy such that objects on the side opposite the viewer are not clearly visible. Examples of suitable materials, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalate, and the like; polysiloxane-containing polymers; or copolymers of any monomers for preparing these, or any mixtures thereof); ceramic substrates; glass substrates; or mixtures or combinations of any of the above. For example, one or more of the plies 12, 18 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat-treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath and controllably cooled to form a float glass ribbon. The ribbon is then cut and/or shaped and/or heat treated as desired. Examples of float glass processes are disclosed in U.S. Pat. Nos. 4,466,562 and 4,671,155. The first and second plies 12, 18 can be, for example, clear float glass or can be tinted or colored glass or one ply 12, 18 can be clear glass and the other ply 12, 18 colored glass. Although not limiting to the invention, examples of glass suitable for the first ply 12 and/or second ply 18 are described in U.S. Pat. Nos. 4,746, 347; 4,792,536; 5,030,593; 5,030,594; 5,240,886; 5,385, 872; and 5,393,593. The first and second plies 12, 18 can be of any desired dimensions, e.g., length, width, shape, or thickness. In one exemplary automotive transparency 10, the first and second plies 12, 18 can each be 1 mm to 10 mm thick, e.g., 1 mm to 5 mm thick, or 1.5 mm to 2.5 mm, or 1.8 mm to 2.3 mm. In one non-limiting embodiment, the first ply 12 and/or the second ply 18 can have a visible light transmittance of greater than 90%, such as greater than 91%, at a reference wavelength of 550 nm. The glass composition for the first ply 12 and/or second ply 18 can have a total iron content in the range of greater than 0 weight percent (wt. %) to 0.2 wt. % and/or a redox ratio in the range of 0.3 to 0.6.

In one non-limiting embodiment, one or both of the plies 12, 18 may have a high visible light transmittance at a reference wavelength of 550 nm. By "high visible light transmittance" is meant visible light transmittance at 550 nm greater than or equal to 85%, such as greater than or equal to 87%, such as greater than or equal to 90%, such as greater than or equal to 91%, such as greater than or equal to 92%, at 5.5 mm equivalent thickness for glass from 2 mm to 25 mm sheet thickness. Particularly useful glass for the practice of the invention is disclosed in U.S. Pat. Nos. 5,030,593 and 5,030,594.

The laminated windshield may also include an interlayer 24. The interlayer 24 can be of any desired material and can include one or more layers or plies. The interlayer 24 may be positioned over the No. 2 surface 16 and/or the No. 3 surface 20. The interlayer 24 can be a polymeric or plastic material, such as, for example, polyvinyl butyral ("PVB"), plasticized polyvinyl chloride, or multi-layered thermoplastic materials including polyethyleneterephthalate, etc. Suitable interlayer materials are disclosed, for example but not to be considered as limiting, in U.S. Pat. Nos. 4,287,107 and 3,762,988. The interlayer 24 can also be a sound absorbing or attenuating material as described, for example, in U.S. Pat. No. 5,796,055. The interlayer 24 can have a solar control coating provided thereon or incorporated therein or can include a colored material to reduce solar energy transmission. The interlayer 24 may be of any suitable thickness to hold the plies 12, 18 together. In one non-limiting embodiment, the interlayer 24 is a 0.76 millimeter (mm) thick layer of PVB.

Figure 3:
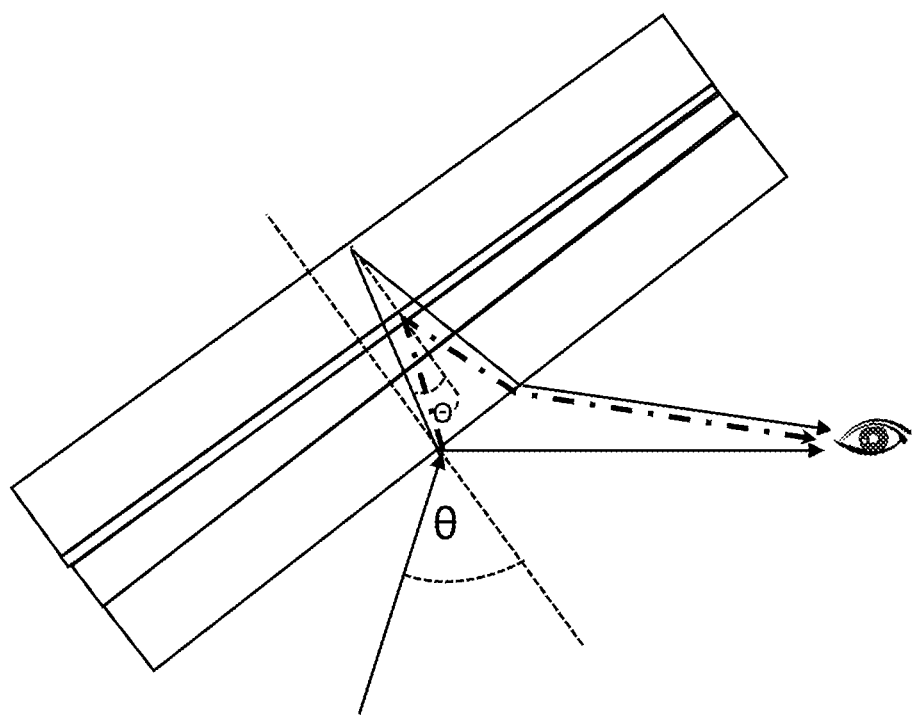
FIG. 3 is an illustration of a windshield with a coating positioned to reduce ghosting when a Heads-Up Display is used.

The coating 30 is deposited over at least a portion of a major surface of one of the glass plies 12, 18 such as on the inner surface 16 of the outboard glass ply 12 or the outer surface 22 of the inner glass ply 18 (FIG. 1, FIG. 3). The coating 30 can include three or four metallic films positioned between dielectric layers applied sequentially over at least a portion of one of the glass plies 12, 18. The coating 30 can be a heat and/or radiation reflecting coating or a solar control coating and can have one or more coating layers or films of the same or different composition and/or functionality. The coating 30 can be a multi-layer coating including three or four metallic layers. Examples of electrically conductive coatings used to make heatable windows are disclosed in U.S. Pat. Nos. 5,653,903 and 5,028,759. Examples of solar control coatings that can be used in the practice of the invention are found in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759, and also U.S. patent application Ser. No. 09/058,440.

Non-limiting examples of suitable coatings typically include one or more antireflective coating films comprising dielectric or anti-reflective materials, such as metal oxides or oxides of metal alloys, which as transparent to visible light. The coating 30 can also include three to four metallic layers comprising a reflective metal, e.g., a noble metal such as silver or gold, or combinations of alloys thereof, and can further comprise a primer layer or barrier film, such as titanium or a titanium aluminum alloy, located over and/or optionally under the metal reflective layer. The coating 30 can have three or four metallic layers; or can have at least three metallic layers; or can have no more than four metallic layers. For example, the coating 30 consists of three metallic layers, i.e., a triple metal coating 32. In another non-limiting embodiment, the coating 30 comprises four metallic layers, i.e., a quadruple metal coating 34. In one non-limiting embodiment, one or more of the metallic layers can comprise silver. In another non-limiting embodiment, one or more of the metallic layers can be a continuous layer. By "continuous layer" is meant that the coating forms a continuous film of the material and not isolated coating regions.

Non-limiting examples of suitable materials for the primer layer include zinc, aluminum, vanadium, tungsten, tantalum, niobium, zirconium, manganese, chromium, tin, nickel, germanium, magnesium, molybdenum, silver, silicon carbon, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof. The primer layer may also take the form of a metal, oxide, sub-oxide, nitride, and/or sub-nitride of any of the above list of materials. At least a portion of the primer layer is an oxide or a nitride. In certain embodiments, the primer layer is deposited in a 100% Argon environment. In certain embodiments, a portion of the primer layer is a nitride formed by sputtering the metal or metal alloy in a nitrogen ($N_2$) atmosphere that has a specific flow rate as to form an atmosphere of 80% $N_2$, with the remainder argon. The flow rate is an approximation to the amount of nitrogen ($N_2$) in the atmosphere, but that one of ordinary skill in the art would recognize that additional $N_2$ may leak into the coating chamber as the coating chamber is not hermetically sealed from the outside environment. In certain embodiments, a portion of the primer layer is a sub-oxide formed by sputtering the metal or metal alloy in an oxygen ($O_2$) atmosphere that has a specific flow rate as to form an atmosphere of 3% to 7% $O_2$, with the remainder argon. The flow rate is an approximation to the amount of oxygen ($O_2$) in the atmosphere, but that one of ordinary skill in the art would recognize that additional $O_2$ may leak into the coating chamber as the coating chamber is not hermetically sealed from the outside environment. The chemical structure of the primer material is designated by weight percent (wt. %) of an element, x. For certain compositions, the lower limit of one of the materials in the composition may be "greater than 0". When the lower limit is "greater than 0", the weight percent of the material is not equal to zero but may be any wt. % greater than 0 and up to the wt. % of the upper limit. The composition can change before or after the layer is heated, due to reactions with atmospheric species. These reactions can change the wt. % distributed between the materials of the composition. Compositions of non-limiting examples of primer layers can be found in Table 1, where before heating is BH and after heating is AH. Some materials may only have only BH or AH measurements due to that measurement being more important for the final composition.

TABLE 1

Compositions of Metals for Metal Alloys Used as Primer Layers

| Material | Range (wt. %) | Preferred Range (wt. %) | More Preferred Range (wt. %) | Most Preferred Range (wt. %) |
|---|---|---|---|---|
| $Al_xZn_{1-x}$ | x = >0 to 30 | x = >0 to 20 | x = >0 to 15 | x = 1 to 12 |
| $Ga_xZn_{1-x}$ | x = >0 to 20 | x = >0 to 15 | x = >0 to 10 | x = 1 to 5 |
| $In_xZn_{1-x}$ | x = >0 to 40 | x = >0 to 18 | x = >0 to 15 | x = 1 to 10 |
| $V_xZn_{1-x}$ | x = >0 to 20 | x = >0 to 15 | x = >0 to 10 | x = 1 to 5 |
| $Ag_xZn_{1-x}$ | x = >0 to 50 | x = >0 to 40 | x = >0 to 30 | x = 5 to 30 |
| $Al_xTi_{1-x}$ | x = 2 to 75 (BH) | x = 2 to 60 (BH) | x = 2 to 50 (BH) | x = 2 to 40 (BH) |
| | x = 1 to 100 (AH) | x = 1 to 98 (AH) | x = 2 to 95 (AH) | x = 2 to 15 (AH) |
| | | | | x = 20 to 95 (AH) |
| $Al_xNb_{1-x}$ | x = 2 to 40 (BH) | x = 2 to 30 (BH) | x = 2 to 19 (BH) | x = 2 to 13 (BH) |
| | x = 2 to 95 (AH) | x = 2 to 80 (AH) | x = 3 to 60 (AH) | x = 4 to 45 (AH) |
| $Al_xNb_{1-x}$ nitride | x = 1 to 100 (BH) | x = 1 to 98 (BH) | x = 1 to 95 (BH) | x = 2 to 93 (BH) |
| | x = 1 to 100 (AH) | x = 2 to 75 (AH) | x = 3 to 50 (AH) | x = 4 to 40 (AH) |
| $W_xTi_{1-x}$ Sub-oxide (7% $O_2$ deposition) | x = 55 to 100 (BH) | x = 65 to 100 (BH) | x = 75 to 100 (BH) | x = 80 to 100 (BH) |
| $W_xTi_{1-x}$ sub-oxide (3% $O_2$ deposition) | x = 30 to 95 (AH) | x = 40 to 95 (AH) | x = 50 to 95 (AH) | x = 55 to 95 (AH) |
| $Ti_xTa_{1-x}$ | x = 2 to 80 (BH) | x = 2 to 60 (BH) | x = 2 to 35 (BH) | x = 2 to 20 |
| | x = 2 to 40 (AH) | x = 2 to 30 (AH) | x = 2 to 25 (AH) | (BH and AH) |
| $Ti_xNb_{1-x}$ | x = 2 to 95 (AH) | x = 2 to 93 (AH) | x = 3 to 92 (AH) | x = 5 to 90 (AH) |
| $Ti_xNb_{1-x}$ nitride | x = 1 to 65 | x = 1 to 50 | x = 1 to 40 | x = 1 to 30 |
| $Nb_xZr_{1-x}$ | x = 1 to 80 (BH) | x = 1 to 70 (BH) | x = 1 to 60 (BH) | x = 1 to 50 (BH) |
| | x = 60 to 100 (AH) | x = 70 to 100 (AH) | x = 80 to 100 (AH) | x = 85 to 100 (AH) |
| $Ta_xW_{1-x}$ | x = 2 to 95 (BH) | x = 2 to 80 (BH) | x = 3 to 60 (BH) | x = 5 to 50 (BH) |
| $W_xNb_{1-x}$ | x = 5 to 100 (BH) | x = 6 to 90 (BH) | x = 8 to 80 (BH) | x = 10 to 70 (BH) |
| | x = 2 to 50 (AH) | x = 2 to 45 (AH) | x = 2 to 40 (AH) | x = 2 to 30 (AH) |

TABLE 1-continued

Compositions of Metals for Metal Alloys Used as Primer Layers

| Material | Range (wt. %) | Preferred Range (wt. %) | More Preferred Range (wt. %) | Most Preferred Range (wt. %) |
|---|---|---|---|---|
| $W_xNb_{1-x}$ | x = 2 to 90 (BH) | x = 5 to 80 (BH) | x = 7 to 75 (BH) | x = 10 to 70 (BH) |
| nitride | x = 2 to 70 (AH) | x = 10 to 70 (AH) | x = 20 to 70 (AH) | x = 30 to 70 (AH) |
| $Zn_xTi_{1-x}$ | x = 10 to 100 (BH) | x = 10 to 80 (BH) | x = 10 to 70 (BH) | x = 10 to 60 (BH) |
|  | x = 20 to 100 (AH) | x = 40 to 97 (AH) | x = 50 to 94 (AH) | x = 60 to 90 (AH) |

For vision panels (such as a windshield) in the United States, the transparency should also have a visible light transmittance of greater than or equal to 70%, such as greater than or equal to 71%. As will be appreciated by one skilled in the art, several different competing factors need to be balanced to provide a coating having sufficient conductivity, transmittance, and color. For example, as the distance D between bus bars 96, 98 increases (i.e., the transparency becomes wider from top to bottom), the bus bar 96 to bus bar 98 resistance increases. As the bus bar 96 to bus bar 98 resistance increases, the power density decreases. In order to maintain the power density, as the bus bar 96 to bus bar 98 distance D is increased, the resistivity of the coating 30 must decrease. One way of decreasing the resistivity is by increasing the thickness of one or more of the metallic layers in the coating 30 and/or by increasing the number of metallic layers in the coating 30.

The coating 30 can be deposited by any conventional method, such as but not limited to conventional chemical vapor deposition (CVD) and/or physical vapor deposition (PVD) methods. Examples of CVD processes include spray pyrolysis. Examples of PVD processes include electron beam evaporation and vacuum sputtering (such as magnetron sputter vapor deposition (MSVD)). Other coating methods could also be used, such as but not limited to sol-gel deposition. In one non-limiting embodiment, the coating 30 can be deposited by MSVD. Examples of MSVD coating devices and methods will be well understood by one of ordinary skill in the art and are described, for example, in U.S. Pat. Nos. 4,379,040; 4,861,669; 4,898,789; 4,898,790; 4,900,633; 4,920,006; 4,938,857; 5,328,768; and 5,492,750. In the MSVD method, an oxide of a metal or metal alloy can be deposited by sputtering a metal or metal alloy containing cathode in an oxygen containing atmosphere to deposit a metal oxide or metal alloy oxide film on the surface of the substrate. In one embodiment, the coating 30 is deposited over all or substantially all of the surface, i.e., is not deposited to form discrete coated areas. The at least one coating 30 can be deposited over a flat substrate and then the substrate can be bent of shaped in any conventional manner, such as by heating. Alternatively, the at least one coating 30 can be deposited over a curved surface, i.e., a substrate that has already been bent or shaped.

In an exemplary embodiment, the invention is a coating useful for a HUD in a windshield, as shown in FIG. 1, FIG. 2A, FIG. 2B, and FIG. 3, wherein the windshield comprises a first ply 12 and second ply 18 and interlayer 24. A coating 30 may be positioned on the No. 2 surface 16 or the No. 3 surface 20, preferably on the No. 2 surface 16.

Figure 2A:
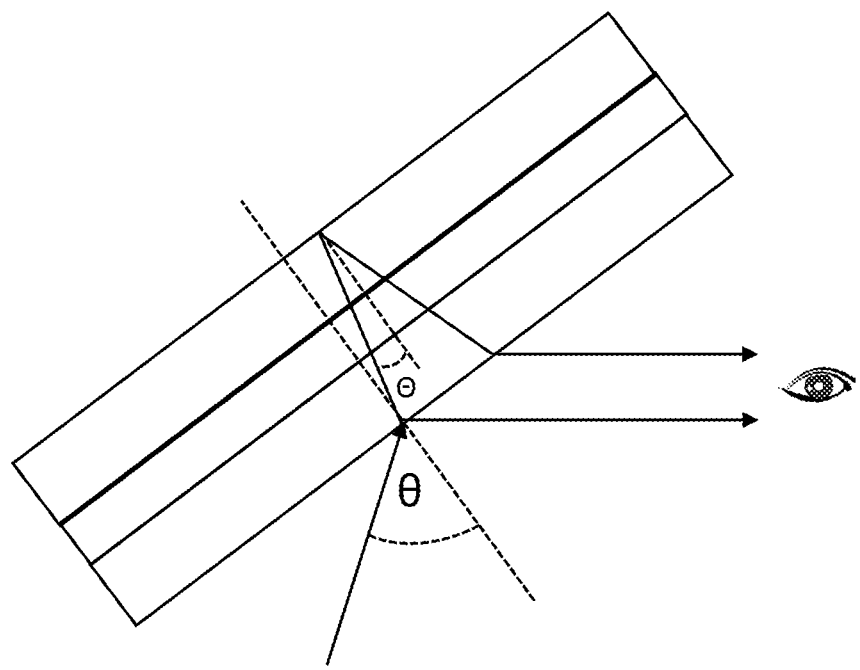
FIG. 2A-2B is an illustration of a windshield showing ghosting effects created when a Heads-Up Display is used.

In reference to FIG. 2A, radiation 36 directed at the transparency 10 directs off the transparency 10, such that at least a portion of the radiation 36 is reflected off of the transparency 10 and is directed in the eye 38 of the driver. The portion of the radiation 36 that is not reflected off the transparency 10 may be refracted, absorbed, or otherwise transmitted through the transparency 10. Since the PVB interlayer 24 has a refractive index similar to that of the glass plies 12, 18, a reflection coming from the No. 1 surface 14 from the radiation and the No. 4 surface 22 creates a ghost image into the driver's eye 38 when the glass plies 12, 18 and PVB interlayer 24 within the windshield are parallel each other.

Figure 2B:
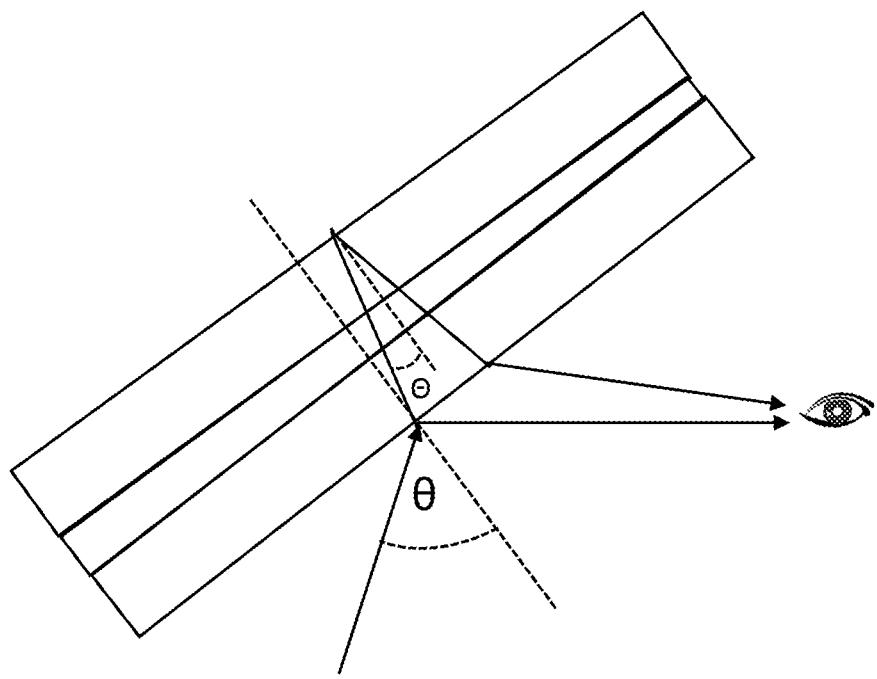

Referring to FIG. 2B, the first ply 12 may be non-parallel to the second ply 18. Preferably, to eliminate ghost images when exposed to radiation 36, the interlayer 24 has a wedge shape wherein one side of the interlayer 24 is thicker than another side. The wedge shape of the interlayer 24 may be configured such that the two reflection images from the No. 1 surface 14 and No. 4 surface 22 overlap at the driver's eye 38 to eliminate ghosting.

A silver coating can be applied to the No. 2 surface 16 or the No. 3 surface 22, preferably the No. 2 surface 16 as described above, as silver coatings lower energy and increase solar performance. However, a silver coating applied on the No. 2 surface 16 would create a strong light reflection from radiation 36 and add a triple ghost image into the driver's eyes 38. Referring to FIG. 3, to eliminate reflection from the surface, a specific coating 30 including metallic layers must be designed in such a way that the total internal reflection into the eyes 38 is low enough or the same as the transparency 10 of FIG. 2B. The specific coating 30 must also be a neutral color in the visible spectral range (from 400 nm to 700 nm), which can be tuned using various dielectric layers. When using a specific coating 30, the interlayer 24 may be a layer of uniform thickness in other arrangements of the transparency 10, as the interlayer 24 may not need to be wedge-shaped to avoid the ghosting issue because other aspects of the design counteract ghosting.

Figure 4:
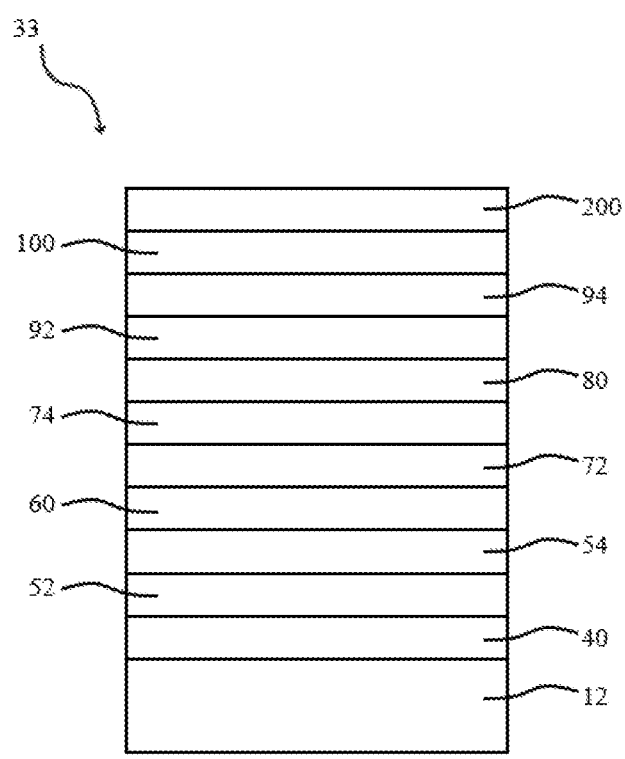
FIG. 4 is a cross-sectional view (not to scale) of a non-limiting triple metal coating according to the invention.
Figure 6:
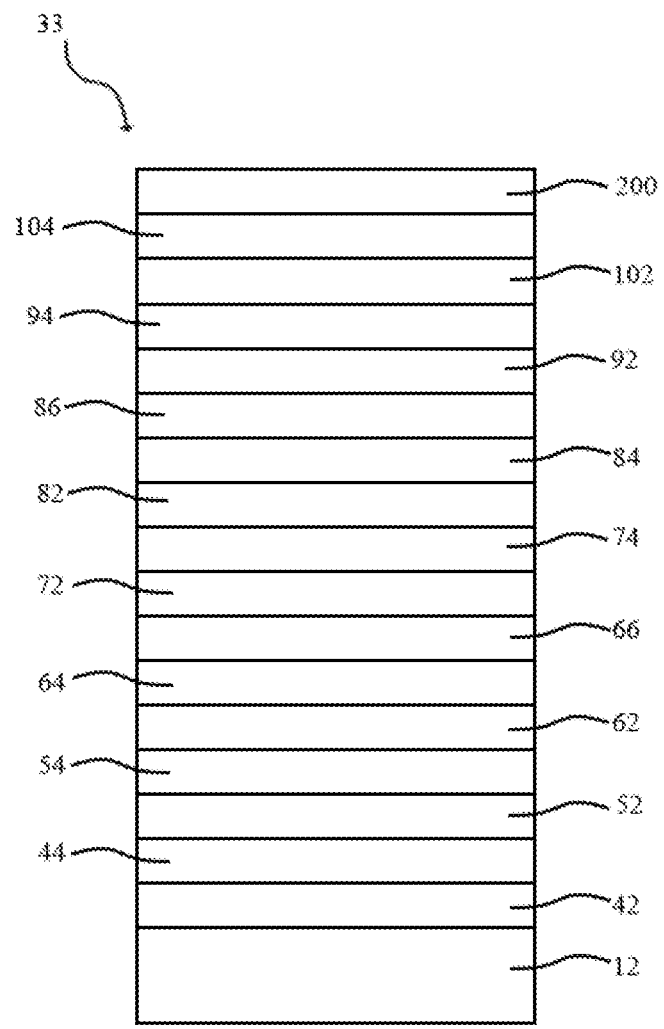
FIG. 6 is a cross-sectional view (not to scale) of a non-limiting triple metal coating of according to the invention.
Figure 7:
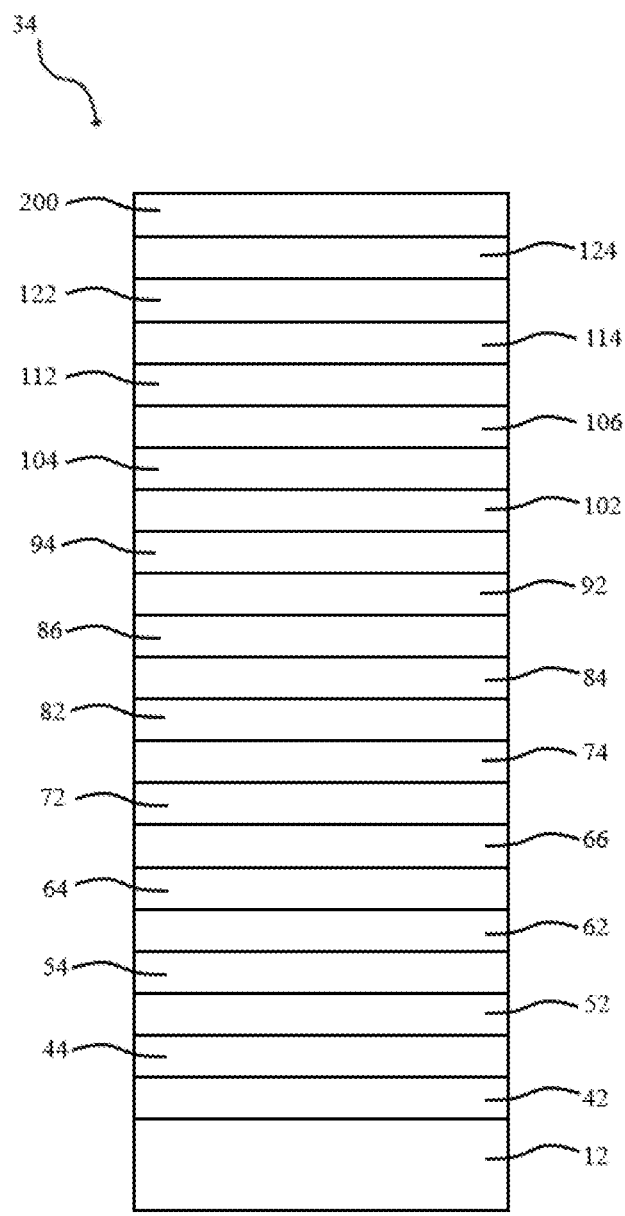
FIG. 7 is a cross-sectional view (not to scale) of a non-limiting quadruple metal coating according to the invention.
Figure 8:
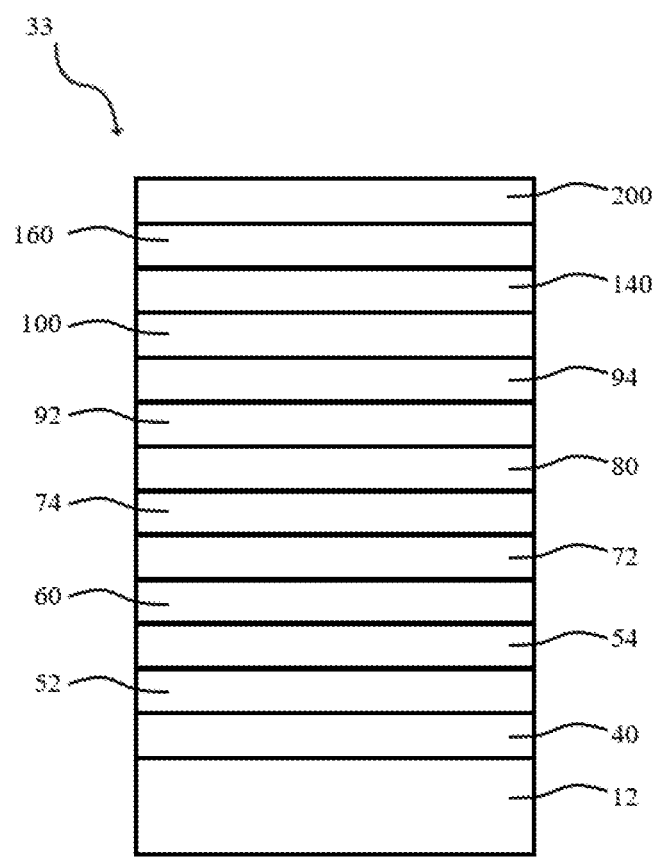
FIG. 8 is a cross-sectional view (not to scale) of a non-limiting triple metal coating according to the invention.
Figure 9:
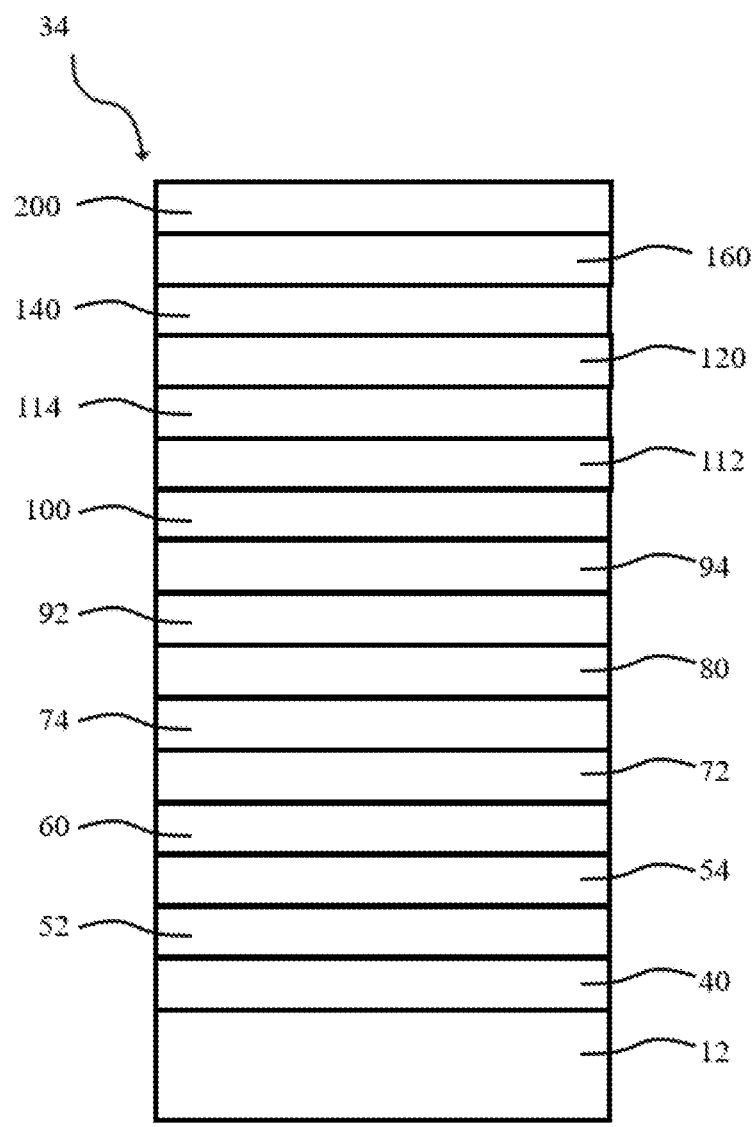
FIG. 9 is a cross-sectional view (not to scale) of a non-limiting quadruple metal coating according to the invention.

The coating 30 can be a triple metal coating 33, e.g., three metallic layers, or a quadruple metal coating 34 (e.g., four metallic layers). Exemplary non-limiting coatings suitable for the triple metal coating 33 are shown in FIGS. 4, 6, and 8. Exemplary non-limiting coatings suitable for the quadruple coating 34 are shown in FIGS. 5, 7, and 9.

An exemplary coating 30 includes three metallic layers (i.e., a triple metal coating 33) positioned between dielectric layers, as shown in FIG. 4. The triple metal coating 33 includes a base layer or first dielectric layer 40 positioned over or in direct contact with at least a portion of a major surface of a substrate (e.g., the No. 2 surface 16 of the first ply 12, or the No. 3 surface 20 of the second ply 18). A first metallic layer 52 is positioned over or in direct contact with at least a portion of the first dielectric layer 40. An optional first primer layer 54 may be positioned over or in direct contact with at least a portion of the first metallic layer 52. A second dielectric layer 60 is positioned over or in direct contact with the optional first primer layer 54 or the first metallic layer 52. A second metallic layer 72 is positioned over or in direct contact with at least a portion of the second dielectric layer 60. An optional second primer layer 74 may be positioned over or in direct contact with the second metallic layer 72. A third dielectric layer 80 is positioned over or in direct contact with the optional second primer layer 74 or the second metallic layer 72. A third metallic layer 92 may be positioned over at least a portion of the third dielectric layer 80. An optional third primer layer 94 may be positioned over at least a portion of the third metallic layer 92. A fourth dielectric layer 100 is positioned over at least a portion of the third metallic layer 92 or optional third primer layer 94. An optional outermost protective layer 200 may be positioned over or in direct contact with the fourth dielectric layer 100.

Figure 5:
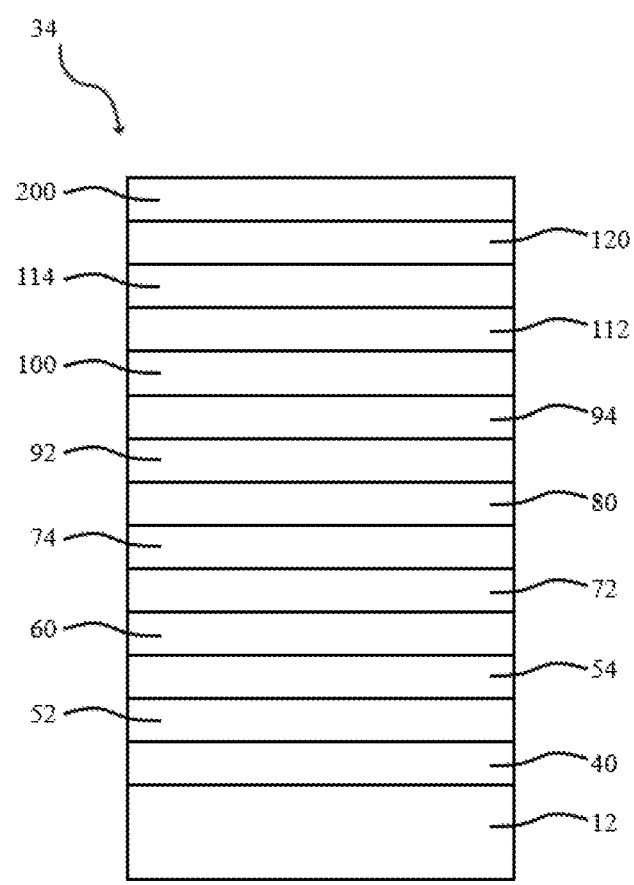
FIG. 5 is a cross-sectional view (not to scale) of a non-limiting quadruple metal coating according to the invention.

An exemplary coating 30 includes four metallic layers (i.e., a quadruple metal coating 34) positioned between dielectric layers, as shown in FIG. 5. The quadruple metal coating 34 includes a base layer or first dielectric layer 40 positioned over or in direct contact with at least a portion of a major surface of a substrate (e.g., the No. 2 surface 16 of the first ply 12, or the No. 3 surface 20 of the second ply 18). A first metallic layer 52 is positioned over or in direct contact with at least a portion of the first dielectric layer 40. An optional first primer layer 54 may be positioned over or in direct contact with at least a portion of the first metallic layer 52. A second dielectric layer 60 is positioned over or in direct contact with the optional first primer layer 54 or the first metallic layer 52. A second metallic layer 72 is positioned over or in direct contact with at least a portion of the second dielectric layer 60. An optional second primer layer 74 may be positioned over or in direct contact with the second metallic layer 72. A third dielectric layer 80 is positioned over or in direct contact with the optional second primer layer 74 or the second metallic layer 72. A third metallic layer 92 may be positioned over at least a portion of the third dielectric layer 80. An optional third primer layer 94 may be positioned over at least a portion of the third metallic layer 92. A fourth dielectric layer 100 is positioned over at least a portion of the third metallic layer 92 or optional third primer layer 94. A fourth metallic layer 112 is positioned over at least a portion of the fourth dielectric layer 100. An optional primer layer 114 is formed over at least a portion of the fourth metallic layer 112. A fifth dielectric layer 120 is formed over at least a portion of the fourth metallic layer 112 or optional fourth primer layer 114. An optional outermost protective layer 200 may be positioned over or in direct contact with the fifth dielectric layer 120.

The dielectric layers can comprise one or more films of antireflective materials and/or dielectric materials, such as, but not limited to metal oxides, oxides of metal alloys, nitrides, oxynitrides, or mixtures thereof. The first dielectric layer can be transparent to visible light. Examples of suitable metal oxides for the first dielectric layer include oxides of titanium, niobium, zinc, indium, tin, magnesium, gallium, vanadium, aluminum, silicon, alloys thereof, mixtures thereof, and combinations thereof. These metal oxides can have small amount of other materials, such as manganese in bismuth oxide, tin in indium oxide, etc. Alternatively, oxides or metal alloys or metal mixtures, such as oxides containing zinc and tin (e.g., zinc stannate); oxides of indium-tin alloys; silicon nitrides; silicon aluminum nitrides; or aluminum nitrides can be used. Further, metal doped metal oxides, such as aluminum-doped zinc oxide, antimony-doped tin oxide, nickel- or boron-doped silicon oxides, gallium-doped zinc oxide, indium-doped zinc oxide, magnesium-doped zinc oxide, vanadium-doped zinc oxide, indium-doped tin oxides, or mixtures thereof can be used. In one non-limiting embodiment, the first film of the first dielectric layer 42 can be a zinc/tin alloy oxide formed over at least a portion of the substrate (e.g., the No. 2 surface 16 of the first ply 12, or the No. 3 surface 20 of the second ply 18). The zinc/tin alloy oxide can be obtained from MSVD from a cathode of zinc and tin that can comprise zinc and tin in proportions of 10 wt. % to 90 wt. % zinc and 90 wt. % to 10 wt. % tin. One suitable metal alloy oxide that can be present in the first film of the first dielectric layer 42 is zinc stannate. By "zinc stannate" is meant a composition of $Zn_xSn_{1-x}O_{2-x}$ (Formula 1) where "x" varies in the range of greater than 0 to less than 1. For instance, "x" can be greater than 0 and can be any fraction or decimal between greater than 0 to less than 1. For example, where x=⅔, Formula 1 is $Zn_{2/3}Sn_{1/3}O_{4/3}$, which is more commonly described at $Zn_2SnO_4$. A zinc stannate containing film has one or more of the forms of Formula 1 in a predominant amount in the film.

The second film of the first dielectric layer 44 is formed over at least a portion of the first film of the first dielectric layer 42 and can comprise zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one non-limiting embodiment, the second film of the first dielectric layer 44 can be a zinc-containing film, such as zinc oxide. The zinc oxide film can be deposited from a zinc cathode that includes other materials to improve the sputtering characteristics of the cathode. For example, the zinc cathode can include a small amount (e.g., less than 10 wt. %, such as greater than 0 to 5 wt. %) of tin to improve sputtering. In which case, the resultant zinc oxide film would include a small percentage of tin oxide, e.g., 0 to less than 10 wt. % tin oxide, e.g., 0 to 5 wt. % tin oxide. An oxide layer sputtered from a zinc/tin cathode having 95 wt. % zinc and 5 wt. % tin, or preferably 90 wt. % zinc and 10 wt. % tin, is referred to as a zinc oxide film. The small amount of tin in the cathode (e.g., less than 10 wt. %) is believed to form a small amount of tin oxide in the predominately zinc oxide-containing second film of the first dielectric layer 44. One non-limiting embodiment is in which the first film of the first dielectric layer 42 is zinc stannate and the second film of the first dielectric layer 44 is zinc oxide and over at least a portion of the first film of the first dielectric layer 42.

In an exemplary non-limiting embodiment, the second film 44 is a film consisting of at least one of the following: aluminum-doped zinc oxide, gallium doped-zinc oxide, indium-doped zinc oxide, magnesium-doped zinc oxide, vanadium-doped zinc oxide, or indium-doped tin oxide. The aluminum-doped zinc oxide, gallium doped-zinc oxide, indium-doped zinc oxide, magnesium-doped zinc oxide, vanadium-doped zinc oxide, or indium-doped tin oxide film is deposited from a zinc cathode that includes other materials to improve the sputtering characteristics of the cathode. For example, the aluminum-doped zinc oxide, gallium doped-zinc oxide, indium-doped zinc oxide, magnesium-doped zinc oxide, vanadium-doped zinc oxide, or indium-doped tin oxide film can include a small amount (e.g., less than 10 wt. %, such as greater than 0 to 5 wt. %) of tin to improve sputtering. In which case, the resultant aluminum-doped zinc oxide, gallium doped-zinc oxide, indium-doped zinc oxide, magnesium-doped zinc oxide, vanadium-doped zinc oxide, or indium-doped tin oxide film would include a small percentage of tin oxide, e.g., 0 wt. % to less than 10 wt. % tin oxide, e.g., 0 wt. % to 5 wt. % tin oxide.

One non-limiting embodiment is in which the first film of the first dielectric layer 42 is zinc stannate and the second film of the first dielectric layer 44 comprises zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide over at least a portion of the first film of the first dielectric layer 42.

seed film comprises $Sn_xIn_{1-x}$ oxide. In another embodiment, the seed film comprises Ag deposited in an oxygen/argon gas environment. In another embodiment, the seed film comprises $Al_xAg_{1-x}$. The seed film can have a total thickness in the range of 0.5 nm to 10 nm, preferably 0.75 nm to 8 nm, more preferably 0.9 nm to 6 nm. In some embodiments, the first dielectric layer 40 comprises a first film 42, a second film 44, and a seed film.

TABLE 2

Compositions of Metals for Metal Alloys Used as Seed Film

| Material | Range (wt. %) | Preferred Range (wt. %) | More Preferred Range (wt. %) | Most Preferred Range (wt. %) |
|---|---|---|---|---|
| Ag deposited in $O_2$ gas environment | x = 1 to 70% gas flow | x = 1 to 50% gas flow | x = 10 to 40% gas flow | x = 20 to 40% gas flow |
| $Al_xAg_{1-x}$ | x = 1 to 35 (BH and AH) | x = 1 to 20 (BH and AH) | x = 1 to 18 (BH and AH) | x = 1 to 15 (BH and AH) |
| $Al_xZn_{1-x}$ oxide | x = 1 to 25 | x = 1 to 15 | x = 1 to 12 | x = 1 to 10 |
| $Ga_xZn_{1-x}$ oxide | x = 1 to 20 | x = 1 to 15 | x = 1 to 10 | x = 1 to 5 |
| $Sn_xIn_{1-x}$ oxide | x = 1 to 20 | x = 2 to 18 | x = 4 to 15 | x = 5 to 12 |
| $V_xZn_{1-x}$ oxide | x = 1 to 25 | x = 1 to 15 | x = 1 to 10 | x = 1 to 8 |

The first dielectric layer 40 of the triple metal coating 33 can have a total thickness in the range of 10 nm to 50 nm, preferably 12 nm to 45 nm, more preferably 15 nm to 42 nm, most preferably 18 nm to 40 nm. The first dielectric layer 40 of the quadruple metal coating 34 can have a total thickness in the range of 20 nm to 55 nm, preferably 25 nm to 50 nm, more preferably 30 nm to 45 nm, most preferably 35 nm to 40 nm.

In one non-limiting embodiment, the first dielectric layer 40 comprises a seed film, not depicted within the figures, in direct contact with the first metallic layer 52. The seed film can comprise aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof. In one embodiment, the seed film can comprise aluminum zinc, vanadium zinc, zinc, silver zinc, metals thereof, alloys thereof, oxides thereof, or sub-oxides thereof. In another embodiment, the seed film can comprise gallium zinc, indium zinc, indium tin, metals thereof, alloys thereof, oxides thereof, or sub-oxides thereof. Compositions of non-limiting examples of seed film can be found in Table 2. In certain embodiments, a portion of the seed film is formed in an $O_2$ atmosphere that has a specific flow rate as to form an atmosphere of 1% to 70% $O_2$, with the remainder argon. The flow rate is an approximation to the amount of $O_2$ in the atmosphere, but that one of ordinary skill in the art would recognize that additional $O_2$ may leak into the coating chamber as the coating chamber is not hermetically sealed from the outside environment. In one non-limiting embodiment, the second film of the first dielectric layer 44 is the seed film. In another embodiment, the seed film comprises $V_xZn_{1-x}$ oxide. In another embodiment, the seed film comprises $Al_xZn_{1-x}$ oxide. In another embodiment, the seed film comprises $Ga_xZn_{1-x}$ oxide. In another embodiment, the seed film comprises $In_xZn_{1-x}$ oxide. In another embodiment, the A first metallic layer 52 can be deposited over at least a portion of the first dielectric layer 40. The first metallic layer 52 can include a reflective metal, such as but not limited to metallic gold, silver, alloys thereof, mixtures thereof, or combinations thereof. The first metallic layer 52 is a continuous layer. In one embodiment, the first metallic layer 52 of the triple metal coating 33 comprises a metallic silver. The first metallic layer 52 of the triple metal coating 33 can have a total thickness in the range of 5 nm to 20 nm, preferably 5 nm to 17.5 nm, more preferably 7 nm to 15 nm, most preferably 8 nm to 10.5 nm.

In one embodiment, the first metallic layer 52 of the quadruple metal coating 34 comprises metallic silver. In another embodiment, the first metallic layer 52 of the quadruple metal coating 34 is a continuous layer. The first metallic layer 52 of the quadruple metal coating 34 can have a total thickness in the range of 2 nm to 20 nm, preferably 6 nm to 18 nm, more preferably 9 nm to 12 nm, most preferably 9.5 nm to 10 nm.

An optional first primer layer 54 may be deposited over at least a portion of the first metallic layer 52. The first primer layer 54 can be an oxygen-capturing material, such as titanium, that can be sacrificial during the deposition process to prevent degradation or oxidation of the first metallic layer during the sputtering process or subsequent heating processes. The oxygen-capturing material can be chosen to oxidize before the material of the first metallic layer 52. The composition of the first primer layer 54 is selected from a group consisting of zinc, aluminum, vanadium, tungsten, tantalum, niobium, zirconium, manganese, chromium, tin, nickel, germanium, magnesium, molybdenum, silver, silicon carbon, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof, where the primer is deposited as a metal and subsequently oxidized. At least a portion of the primer layer is a nitride or an oxide. If silver zinc, zinc, silver zinc oxide, titanium, aluminum zinc oxide, indium zinc oxide, gallium zinc oxide, or vanadium zinc oxide is used as the first primer layer 54, it would preferably oxidize before oxidation of the underlying metallic layer. In one embodiment, the first primer layer 54 of the triple and quadruple metal coating 33, 34 is titanium. In another embodiment, the first primer layer 54 of the triple and quadruple metal coating 33, 34 comprises silver zinc. In another embodiment, the first primer layer 54 of the triple and quadruple metal coating 33, 34 comprises zinc. In another embodiment, the first primer layer 54 of the triple and quadruple metal coating 33, 34 is $Ag_xZn_{1-x}$. In another embodiment, the first primer layer 54 of the triple and quadruple metal coating 33, 34 is $Ag_xZn_{1-x}$ oxide. In another embodiment, the first primer layer 54 of the triple and quadruple metal coating 33, 34 comprises $Al_xZn_{1-x}$ oxide. In another embodiment the first primer layer 54 of the triple and quadruple metal coating 33, 34 comprises $In_xZn_{1-x}$ oxide. In another embodiment, the first primer layer 54 of the triple and quadruple metal coating 33, 34 comprises $Ga_xZn_{1-x}$ oxide. In another embodiment, the first primer layer 54 of the triple and quadruple metal coating 33, 34 comprises $V_xZn_{1-x}$ oxide. In another embodiment, the first primer layer 54 of the triple and quadruple metal coating 33, 34 comprises $Al_xTi_{1-x}$ oxide. In another embodiment, the first primer layer 54 of the triple and quadruple metal coating 33, 34 comprises $Al_xNb_{1-x}$ oxide. In another embodiment, the first primer layer 54 of the triple and quadruple metal coating 33, 34 comprises $Al_xNb_{1-x}$ nitride. In another embodiment, the first primer layer 54 of the triple and quadruple metal coating 33, 34 comprises $W_xNb_{1-x}$ nitride. In another embodiment, the first primer layer 54 of the triple and quadruple metal coating 33, 34 comprises $W_xTi_{1-x}$ oxide. In another embodiment, the first primer layer 54 of the triple and quadruple metal coating 33, 34 comprises $Ti_xTa_{1-x}$ oxide. In another embodiment, the first primer layer 54 of the triple and quadruple metal coating 33, 34 comprises $Ti_xNb_{1-x}$ oxide. In another embodiment, the first primer layer 54 of the triple and quadruple metal coating 33, 34 comprises $Ti_xNb_{1-x}$ nitride. In another embodiment, the first primer layer 54 of the triple and quadruple metal coating 33, 34 comprises $Nb_xZr_{1-x}$ oxide. In another embodiment, the first primer layer 54 of the triple and quadruple metal coating 33, 34 comprises $Ta_xW_{1-x}$ oxide. In another embodiment, the first primer layer 54 of the triple and quadruple metal coating 33, 34 comprises $W_xNb_{1-x}$ oxide. In another embodiment, the first primer layer 54 of the triple and quadruple metal coating 33, 34 comprises $Zn_xTi_{1-x}$ oxide. The first primer layer 54 of the triple and quadruple metal coating 33, 34 has a total thickness in the range of 0.5 nm to 5 nm, preferably 1.0 nm to 2.5 nm, more preferably 1.5 nm to 2.5 nm.

A second dielectric layer 60 can be deposited over at least a portion of the first metallic layer 52 or the optional first primer layer 54. The second dielectric layer 60 can also include one or more materials discussed above with respect to the first dielectric layer 40. The second dielectric layer 60 can include a first film of the second dielectric layer 62 deposited over the first metallic layer 52 or the optional first primer layer 54. The first film of the second dielectric layer 62 comprises an oxide, a nitride, an oxynitride, or a mixture thereof of a metal selected from the group consisting of titanium, niobium, zinc, indium, tin, silicon, magnesium, gallium, vanadium, aluminum, alloys thereof, mixtures thereof, or combinations thereof. The first film of the second dielectric layer 62 can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one embodiment the first film of the second dielectric layer 62 comprises zinc oxide. In another embodiment, the first film of the second dielectric layer 62 comprises aluminum-doped zinc oxide. In another embodiment, the first film of the second dielectric layer 62 comprises indium-doped zinc oxide. In another embodiment, the first film of the second dielectric layer 62 comprises gallium-doped zinc oxide. In another embodiment, the first film of the second dielectric layer 62 comprises indium-doped tin oxide. In another embodiment, the first film of the second dielectric layer 62 comprises vanadium-doped zinc oxide.

The second film of the second dielectric layer 64 can be deposited over at least a portion of the first film of the second dielectric layer 62. The second film of the second dielectric layer 64 comprises an oxide, a nitride, an oxynitride, or a mixture therefore of a metal selected from the group consisting of titanium, niobium, zinc, indium, tin, silicon, magnesium, gallium, vanadium, aluminum, alloys thereof, mixtures thereof, or combinations thereof. In one non-limiting embodiment, the second film of the second dielectric layer 64 is zinc stannate.

An optional third film of the second dielectric layer 66 can be deposited over at least a portion of the second film of the second dielectric layer 64. The optional third film of the second dielectric layer 66 can comprise comprises an oxide, a nitride, an oxynitride, or a mixture therefore of a metal selected from the group consisting of titanium, niobium, zinc, indium, tin, silicon, magnesium, gallium, vanadium, aluminum, alloys thereof, mixtures thereof, or combinations thereof. The optional third film of the second dielectric layer 66 can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one embodiment, the optional third film of the second dielectric layer 66 comprises zinc oxide. In another embodiment, the third film of the second dielectric layer 66 comprises indium-doped zinc oxide. In another embodiment, the third film of the second dielectric layer 66 comprises gallium-doped zinc oxide. In another embodiment, the third film of the second dielectric layer 66 comprises indium-doped tin oxide. In another embodiment, the third film of the second dielectric layer 66 comprises vanadium-doped zinc oxide. In another embodiment, the first dielectric layer 40 or the second dielectric layer 60 comprises a silicon nitride film.

One non-limiting embodiment is in which the first film of the second dielectric layer 62 comprises zinc oxides, the second film of the second dielectric layer 64 comprises zinc stannate, and the third film of the second dielectric layer 66 comprises zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide over at least a portion of the second film of the second dielectric layer 64.

The second dielectric layer 60 of the triple metal coating 33 can have a total thickness in the range of 40 nm to 110 nm, preferably 50 nm to 100 nm, more preferably 55 nm to 80 nm, most preferably 67 nm to 76 nm. The second dielectric layer 60 of the quadruple metal coating 34 can have a total thickness in the range of 60 nm to 100 nm, preferably 65 nm to 95 nm, more preferably 70 nm to 90 nm, most preferably 74 nm to 80 nm.

In one non-limiting embodiment, the second dielectric layer 60 comprises a seed film positioned in direct contact with the second metallic layer 72, not depicted within the figures. The seed film can comprise aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof. In one embodiment, the seed film can comprise aluminum zinc, vanadium zinc, zinc, silver zinc, metals thereof, alloys thereof, oxides thereof, or sub-oxides thereof. In another embodiment, the seed film can comprise gallium zinc, indium zinc, indium tin, metals thereof, alloys thereof, oxides thereof, or sub-oxides thereof. Compositions of non-limiting examples of seed film can be found in Table 2. In another embodiment, the seed film comprises $V_xZn_{1-x}$ oxide. In another embodiment, the seed film comprises $Al_xZn_{1-x}$ oxide. In another embodiment, the seed film comprises $Ga_xZn_{1-x}$ oxide. In another embodiment, the seed film comprises $In_xZn_{1-x}$ oxide. In another embodiment, the seed film comprises $Sn_xIn_{1-x}$ oxide. In another embodiment, the seed film comprises Ag deposited in an oxygen/argon gas environment. In another embodiment, the seed film comprises $Al_xAg_{1-x}$. The seed film can have a total thickness in the range of 0.5 nm to 10 nm, preferably 0.75 nm to 8 nm, more preferably 0.9 nm to 6 nm. In some embodiments, the second dielectric layer 60 has a first film 62, a second film 64, and a seed film. In some embodiments, the second dielectric layer 60 has a first film 62, a second film 64, a third film 66, and a seed film.

A second metallic layer 72 can be deposited over at least a portion of the second dielectric layer 60. The second metallic layer 72 is a continuous layer. The second metallic layer 72 can include any one or more of the reflective materials described above with respect to the first metallic layer 52. In one non-limiting embodiment, the second metallic layer 72 comprises metallic silver. The second metallic layer 72 of the triple metal coating 33 can have a total thickness in the range of 5 nm to 20 nm, preferably 5 nm to 15 nm, more preferably 7.5 nm to 12.5 nm, most preferably 8.5 nm to 11.5 nm.

In one embodiment, the second metallic layer 72 of the quadruple metal coating 34 comprises metallic silver. In another embodiment, the second metallic layer 72 of the quadruple metal coating 34 is a continuous layer. The second metallic layer 72 of the quadruple coating 34 can have a total thickness in the range of 2 nm to 20 nm, preferably 6 nm to 18 nm, more preferably 8 nm to 15 nm, most preferably 9 nm to 12 nm.

An optional second primer layer 74 can be deposited over at least a portion of the second metallic layer 72. The second primer layer 74 can be any of the materials described above with respect to the first primer layer 54. In one non-limiting embodiment, the second primer layer 74 of the triple and quadruple metal coating 33, 34 comprises titanium. In another embodiment, the optional second primer layer 74 comprises silver zinc. In another embodiment, the second primer layer 74 comprises zinc. In another embodiment, the optional second primer layer 74 of the triple and quadruple metal coating 33, 34 comprises $Ag_xZn_{1-x}$. In another embodiment, the optional second primer layer 74 of the triple and quadruple metal coating 33, 34 comprises $Ag_xZn_{1-x}$ oxide. In another embodiment, the optional second primer layer 74 of the triple and quadruple metal coating 33, 34 comprises $Al_xZn_{1-x}$ oxide. In another embodiment, the optional second primer layer 74 comprises $In_xZn_{1-x}$ oxide. In another embodiment, the optional second primer layer 74 of the triple and quadruple metal coating 33, 34 comprises $Ga_xZn_{1-x}$ oxide. In another embodiment, the optional second primer layer 74 of the triple and quadruple metal coating 33, 34 comprises $V_xZn_{1-x}$ oxide. In another embodiment, the second primer layer 74 of the triple and quadruple metal coating 33, 34 comprises $Al_xTi_{1-x}$ oxide. In another embodiment, the second primer layer 74 of the triple and quadruple metal coating 33, 34 comprises $Al_xNb_{1-x}$ oxide. In another embodiment, the second primer layer 74 of the triple and quadruple metal coating 33, 34 comprises $Al_xNb_{1-x}$ nitride. In another embodiment, the second primer layer 74 of the triple and quadruple metal coating 33, 34 comprises $W_xNb_{1-x}$ nitride. In another embodiment, the second primer layer 74 of the triple and quadruple metal coating 33, 34 comprises $W_xTi_{1-x}$ oxide. In another embodiment, the second primer layer 74 of the triple and quadruple metal coating 33, 34 comprises $Ti_xTa_{1-x}$ oxide. In another embodiment, the second primer layer 74 of the triple and quadruple metal coating 33, 34 comprises $Ti_xNb_{1-x}$ oxide. In another embodiment, the second primer layer 74 of the triple and quadruple metal coating 33, 34 comprises $Ti_xNb_{1-x}$ nitride. In another embodiment, the second primer layer 74 of the triple and quadruple metal coating 33, 34 comprises $Nb_xZr_{1-x}$ oxide. In another embodiment, the second primer layer 74 of the triple and quadruple metal coating 33, 34 comprises $Ta_xW_{1-x}$ oxide. In another embodiment, the second primer layer 74 of the triple and quadruple metal coating 33, 34 comprises $W_xNb_{1-x}$ oxide. In another embodiment, the second primer layer 74 of the triple and quadruple metal coating 33, 34 comprises $Zn_xTi_{1-x}$ oxide. The optional second primer layer 74 has a total thickness in the range of 0.5 nm to 5 nm, preferably 1.0 nm to 2.5 nm, more preferably 1.5 nm to 2.5 nm.

A third dielectric layer 80 can be deposited over at least a portion of the second metallic layer 72 or the optional second primer layer 74. The third dielectric layer 80 can also include one or more materials discussed above with respect to the first and second dielectric layers. In one non-limiting embodiment, the third dielectric layer 80 comprises a first film of the third dielectric layer 82. The first film of the third dielectric layer 82 comprises an oxide, a nitride, an oxynitride, or a mixture therefore of a metal selected from the group consisting of titanium, niobium, zinc, indium, tin, silicon, magnesium, gallium, vanadium, aluminum, alloys thereof, mixtures thereof, or combinations thereof. The first film of the third dielectric layer 82 can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one embodiment, the first film of the third dielectric layer 82 comprises zinc oxide or zinc stannate. In another embodiment, the first film of the third dielectric layer 82 comprises aluminum-doped zinc oxide. In another embodiment, the first film of the third dielectric layer 82 comprises indium-doped zinc oxide. In another embodiment, the first film of the third dielectric layer 82 comprises gallium-doped zinc oxide. In another embodiment, the first film of the third dielectric layer 82 comprises indium-doped tin oxide. In another embodiment, the first film of the third dielectric layer 82 comprises vanadium-doped zinc oxide.

A second film of the third dielectric layer 84 can be deposited over at least a portion of the first film of the third dielectric layer 82. The second film of the third dielectric layer 84 comprises an oxide, a nitride, an oxynitride, or a mixture thereof of a metal selected from the group consisting of titanium, niobium, zinc, indium, tin, silicon, magnesium, gallium, vanadium, aluminum, alloys thereof, mixtures thereof, or combinations thereof. In one embodiment, the second film of the third dielectric layer 84 comprises zinc stannate. In another embodiment, the second film of the third dielectric layer 84 comprises zinc oxide.

An optional third film of the third dielectric layer 86 can be deposited over at least a portion of the second film of the third dielectric layer 84. The optional third film of the third dielectric layer 86 can comprise an oxide, a nitride, an oxynitride, or a mixture therefore of a metal selected from the group consisting of titanium, niobium, zinc, indium, tin, silicon, magnesium, gallium, vanadium, aluminum, alloys thereof, mixtures thereof, or combinations thereof. The optional third film of the third dielectric layer 86 can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one embodiment, the optional third film of the third dielectric layer 86 comprises zinc oxide. In another embodiment, the third film of the third dielectric layer 86 comprises aluminum-doped zinc oxide. In another embodiment, the third film of the third dielectric layer 86 comprises indium-doped zinc oxide. In another embodiment, the third film of the third dielectric layer 86 comprises gallium-doped zinc oxide. In another embodiment, the third film of the third dielectric layer 86 comprises indium-doped tin oxide. In another embodiment, the third film of the third dielectric layer 86 comprises vanadium-doped zinc oxide.

One non-limiting embodiment is in which the first film of the third dielectric layer 82 comprises zinc oxide or zinc stannate, and the second film of the third dielectric layer 84 comprises zinc oxide or zinc stannate, and the third film of the third dielectric layer 86 comprises silicon nitride, aluminum-doped zinc oxide, gallium doped-zinc oxide, indium-doped zinc oxide, magnesium-doped zinc oxide, vanadium-doped zinc oxide, or indium-doped tin oxide over at least a portion of the second film of the third dielectric layer 84.

The third dielectric layer 80 of the triple metal coating 33 can have a total thickness in the range of 40 nm to 110 nm, preferably 50 nm to 100 nm, more preferably 65 nm to 80 nm, most preferably 71 nm to 75 nm. The third dielectric layer 80 of the quadruple metal coating 34 can have a total thickness in the range of 55 nm to 90 nm, preferably 60 nm to 85 nm, more preferably 68 nm to 80 nm, most preferably 70 nm to 75 nm.

In one non-limiting embodiment, the third dielectric layer 86 comprises a seed film positioned in direct contact with the third metallic layer 92, not depicted within the figures. The seed film can comprise aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof. In one embodiment, the seed film can comprise aluminum zinc, vanadium zinc, zinc, silver zinc, metals thereof, alloys thereof, oxides thereof, or sub-oxides thereof. In another embodiment, the seed film can comprise gallium zinc, indium zinc, indium tin, metals thereof, alloys thereof, oxides thereof, or sub-oxides thereof. Compositions of non-limiting examples of seed film can be found in Table 2. In another embodiment, the seed film comprises $V_xZn_{1-x}$ oxide. In another embodiment, the seed film comprises $Al_xZn_{1-x}$ oxide. In another embodiment, the seed film comprises $Ga_xZn_{1-x}$ oxide. In another embodiment, the seed film comprises $In_xZn_{1-x}$ oxide. In another embodiment, the seed film comprises $Sn_xIn_{1-x}$ oxide. In another embodiment, the seed film comprises Ag deposited in an oxygen/argon gas environment. In another embodiment, the seed film comprises $Al_xAg_{1-x}$. The seed film can have a total thickness in the range of 0.5 nm to 10 nm, preferably 0.75 nm to 8 nm, more preferably 0.9 nm to 6 nm. In some embodiments, the third dielectric layer 80 has a first film 82, a second film 84, and a seed film. In some embodiments, the third dielectric layer 80 has a first film 82, a second film 84, a third film 86, and a seed film. In some embodiments, the third dielectric layer 80 has a first film 82, a second film 84, and a third film 86.

A third metallic layer 92 can be deposited over at least a portion of the third dielectric layer 80. The third metallic layer 92 is a continuous layer. The third metallic layer 92 can include any one or more of the reflective materials described above with respect to the first metallic layer 52. In one non-limiting embodiment, the third metallic layer 92 comprises metallic silver. The third metallic layer 92 of the triple metal coating 33 can have a total thickness in the range of 1 nm to 20 nm, preferably 5 nm to 20 nm, more preferably 7.5 nm to 15 nm, most preferably 7.5 nm to 10.5 nm.

In one embodiment, the third metallic layer 92 of the quadruple metal coating 34 comprises metallic silver. In another embodiment, the third metallic layer 92 of the quadruple metal coating 34 is a continuous layer. The third metallic layer 92 of the quadruple metal coating 34 can have a total thickness in the range of 2 nm to 20 nm, preferably 6 nm to 18 nm, more preferably 8 nm to 15 nm, most preferably 9 nm to 12 nm.

In one non-limiting embodiment, the coating 30 comprises only the first, second, and third metallic layers (FIGS. 4, 6, and 8). There are no additional metallic layers in the coating 30. Each metallic layer has a thickness. In one non-limiting embodiment, the total thickness of the metallic layers for the triple metal coating 33 is in the range of 10 nm to 60 nm, preferably 15 nm to 50 nm, more preferably 20 nm to 40 nm, most preferably 25 nm to 31 nm. In the event the primer layer comprises aluminum and zinc, the total thickness of the metallic layers for the triple metal coating 33 is in the range of 10 nm to 65 nm, preferably 15 nm to 55 nm, more preferably 20 nm to 45 nm, most preferably 25 nm to 36 nm.

An optional third primer layer 94 can be deposited over at least a portion of the third metallic layer 92. The third primer layer 94 can be any of the materials described above with respect to the first primer layer 54. In one non-limiting embodiment, the third primer layer 94 of the triple and quadruple metal coating 33, 34 comprises titanium. In another embodiment, the third primer layer 94 of the triple and quadruple metal coating 33, 34 comprises silver zinc. In another embodiment, the third primer layer 94 of the triple and quadruple metal coating 33, 34 comprises zinc. In another embodiment, the third primer layer 94 of the triple and quadruple metal coating 33, 34 comprises $Ag_xZn_{1-x}$. In another embodiment, the third primer layer 94 of the triple and quadruple metal coating 33, 34 comprises $Ag_xZn_{1-x}$ oxide. In another embodiment, the third primer layer 94 of the triple and quadruple metal coating 33, 34 comprises $Al_xZn_{1-x}$ oxide. In another embodiment, the third primer layer 94 of the triple and quadruple metal coating 33, 34 comprises $In_xZn_{1-x}$ oxide. In another embodiment, the third primer layer 94 of the triple and quadruple metal coating 33, 34 comprises $Ga_xZn_{1-x}$ oxide. In another embodiment, the third primer layer 94 of the triple and quadruple metal coating 33, 34 comprises $V_xZn_{1-x}$ oxide. In another embodiment, the third primer layer 94 of the triple and quadruple metal coating 33, 34 comprises $Al_xTi_{1-x}$ oxide. In another embodiment, the third primer layer 94 of the triple and quadruple metal coating 33, 34 comprises $Al_xNb_{1-x}$ oxide. In another embodiment, the third primer layer 94 of the triple and quadruple metal coating 33, 34 comprises $Al_xNb_{1-x}$ nitride. In another embodiment, the third primer layer 94 of the triple and quadruple metal coating 33, 34 comprises $W_xNb_{1-x}$ nitride. In another embodiment, the third primer layer 94 of the triple and quadruple metal coating 33, 34 comprises $W_xTi_{1-x}$ oxide. In another embodiment, the third primer layer 94 of the triple and quadruple metal coating 33, 34 comprises $Ti_xTa_{1-x}$ oxide. In another embodiment, the third primer layer 94 of the triple and quadruple metal coating 33, 34 comprises $Ti_xNb_{1-x}$ oxide. In another embodiment, the third primer layer 94 of the triple and quadruple metal coating 33, 34 comprises $Ti_xNb_{1-x}$ nitride. In another embodiment, the third primer layer 94 of the triple and quadruple metal coating 33, 34 comprises $Nb_xZr_{1-x}$ oxide. In another embodiment, the third primer layer 94 of the triple and quadruple metal coating 33, 34 comprises $Ta_xW_{1-x}$ oxide. In another embodiment, the third primer layer 94 of the triple and quadruple metal coating 33, 34 comprises $W_xNb_{1-x}$ oxide. In another embodiment, the third primer layer 94 of the triple and quadruple metal coating 33, 34 comprises $Zn_xTi_{1-x}$ oxide.

The third primer layer 94 of the triple and quadruple metal coating 33, 34 has a total thickness in the range of 0.5 nm to 5 nm, preferably 1.0 nm to 2.5 nm, more preferably 1.5 nm to 2.5 nm.

A fourth dielectric layer 100 can be deposited over at least a portion of the third metallic layer 92 or the optional third primer layer 94. The fourth dielectric layer 100 can also include one or more materials discussed above with respect to the first, second, and third dielectric layers 40, 60, 80. In one non-limiting embodiment, the fourth dielectric layer 100 comprises a first film of the fourth dielectric layer 102. The first film of the fourth dielectric layer 102 comprises an oxide, a nitride, an oxynitride, or a mixture therefore of a metal selected from the group consisting of titanium, niobium, zinc, indium, tin, silicon, magnesium, gallium, vanadium, aluminum, alloys thereof, mixtures thereof, or combinations thereof. The first film of the fourth dielectric layer 102 can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one embodiment, the first film of the fourth dielectric layer 102 comprises zinc oxide or zinc stannate. In another embodiment, the first film of the fourth dielectric layer 102 comprises aluminum-doped zinc oxide. In another embodiment, the first film of the fourth dielectric layer 102 comprises indium-doped zinc oxide. In another embodiment, the first film of the fourth dielectric layer 102 comprises gallium-doped zinc oxide. In another embodiment, the first film of the fourth dielectric layer 102 comprises indium-doped tin oxide. In another embodiment, the first film of the fourth dielectric layer 102 comprises vanadium-doped zinc oxide.

A second film of the fourth dielectric layer 104 can be deposited over at least a portion of the first film of the fourth dielectric layer 102. The second film of the fourth dielectric layer 104 comprises an oxide, a nitride, an oxynitride, or a mixture thereof of a metal selected from the group consisting of titanium, niobium, zinc, indium, tin, silicon, magnesium, gallium, vanadium, aluminum, alloys thereof, mixtures thereof, or combinations thereof. In one embodiment, the second film of the fourth dielectric layer 104 comprises zinc stannate or zinc oxide. In some embodiments, the first film 102 and the second film 104 are the only films of the fourth dielectric layer 100.

An optional third film of the fourth dielectric layer 106 can be deposited over at least a portion of the second film of the fourth dielectric layer 104. The optional third film of the fourth dielectric layer 106 can comprise an oxide, a nitride, an oxynitride, or a mixture therefore of a metal selected from the group consisting of titanium, niobium, zinc, indium, tin, silicon, magnesium, gallium, vanadium, aluminum, alloys thereof, mixtures thereof, or combinations thereof. The optional third film of the fourth dielectric layer 106 can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one embodiment, the optional third film of the fourth dielectric layer 106 comprises zinc oxide. In another embodiment, the optional third film of the fourth dielectric layer 106 comprises silicon nitride or silicon oxynitrides. In another embodiment, the optional third film of the fourth dielectric layer 106 comprises aluminum-doped zinc oxide. In another embodiment, the optional third film of the fourth dielectric layer 106 comprises indium-doped zinc oxide. In another embodiment, the optional third film of the fourth dielectric layer 106 comprises gallium-doped zinc oxide. In another embodiment, the optional third film of the fourth dielectric layer 106 comprises indium-doped tin oxide. In another embodiment, the optional third film of the fourth dielectric layer 106 comprises vanadium-doped zinc oxide.

One non-limiting embodiment is in which the first film of the fourth dielectric layer 102 comprises zinc oxide or zinc stannate, and the second film of the fourth dielectric layer 104 comprises zinc oxide or zinc stannate, and the third film of the fourth dielectric layer 106 comprises silicon nitride, aluminum-doped zinc oxide, gallium doped-zinc oxide, indium-doped zinc oxide, magnesium-doped zinc oxide, vanadium-doped zinc oxide, or indium-doped tin oxide over at least a portion of the second film of the third dielectric layer 104.

The fourth dielectric layer 100 of the triple metal coating 33 can have a total thickness in the range of 10 nm to 50 nm, preferably 15 nm to 40 nm, more preferably 20 nm to 35 nm, most preferably 27 nm to 31 nm. The fourth dielectric layer 100 of the quadruple metal coating 34 can have a total thickness in the range of 45 nm to 80 nm, preferably 50 nm to 75 nm, more preferably 55 nm to 70 nm, most preferably 60 nm to 65 nm.

The quadruple metal coatings 34 of FIGS. 5, 7, and 9 include additional layers. In one non-limiting embodiment, the fourth dielectric layer 100 of the quadruple metal coating 34 comprises a seed film positioned in direct contact with the fourth metallic layer 112, not depicted within the figures. The seed film can comprise aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof. The seed film can comprise aluminum zinc, vanadium zinc, zinc, silver zinc, metals thereof, alloys thereof, oxides thereof, or sub-oxides thereof. In another example, the seed film can comprise gallium zinc, indium zinc, indium tin, metals thereof, alloys thereof, oxides thereof, or sub-oxides thereof. Compositions of non-limiting examples of seed films can be found in Table 2. In another embodiment, the seed film comprises $V_xZn_{1-x}$ oxide. In another embodiment, the seed film comprises $Al_xZn_{1-x}$ oxide. In another embodiment, the seed film comprises $Ga_xZn_{1-x}$ oxide. In another embodiment, the seed film comprises $In_xZn_{1-x}$ oxide. In another embodiment, the seed film comprises $Sn_xIn_{1-x}$ oxide. In another embodiment, the seed film comprises Ag deposited in an oxygen/argon gas environment. In another embodiment, the seed film comprises $Al_xAg_{1-x}$. In one non-limiting embodiment, the third film of the fourth dielectric layer 106 of the quadruple metal coating 34 is the seed film. The seed film can have a total thickness in the range of 0.5 nm to 10 nm, preferably 0.75 nm to 8 nm, more preferably 0.9 nm to 6 nm. In some embodiments, the fourth dielectric layer 100 has a first film 102, a second film 104, and a seed film. In some embodiments, the fourth dielectric layer 100 comprises a first film 102, a second film 104, a third film 106, and a seed film.

A fourth metallic layer 112 of the quadruple metal coating 34 can be deposited over at least a portion of the fourth dielectric layer 100. The fourth metallic layer 112 is a continuous layer. The fourth metallic layer 112 can include any one or more of the reflective materials described above with respect to the first metallic layer 52. In one non-limiting embodiment, the fourth metallic layer 112 of the quadruple metal coating 34 comprises metallic silver. The fourth metallic layer 112 of the quadruple metal coating 34 can have a total thickness in the range of 2 nm to 20 nm, preferably 4 nm to 15 nm, more preferably 6 nm to 11 nm, most preferably 7 nm to 10 nm.

An optional fourth primer layer 114 can be deposited over at least a portion of the fourth metallic layer 112 of the quadruple metal coating 34. The fourth primer layer 114 can be any of the materials described above with respect to the first primer layer 54. In one non-limiting embodiment, the fourth primer layer 114 comprises titanium. In another embodiment, the fourth primer layer 114 comprises silver zinc. In another embodiment, the fourth primer layer 114 comprises zinc. In another embodiment, the fourth primer layer 114 comprises $Ag_xZn_{1-x}$. In another embodiment, the fourth primer layer 114 comprises $Ag_xZn_{1-x}$ oxide. In another embodiment, the fourth primer layer 114 comprises $Al_xZn_{1-x}$ oxide. In another embodiment, the fourth primer layer 114 comprises $In_xZn_{1-x}$ oxide. In another embodiment, the fourth primer layer 114 comprises $Ga_xZn_{1-x}$ oxide. In another embodiment, the fourth primer layer 114 comprises $V_xZn_{1-x}$ oxide. In another embodiment, the fourth primer layer 114 of the quadruple metal coating 34 comprises $Al_xTi_{1-x}$ oxide. In another embodiment, the fourth primer layer 114 of the quadruple metal coating 34 comprises $Al_xNb_{1-x}$ oxide. In another embodiment, the fourth primer layer 114 of the quadruple metal coating 34 comprises $Al_xNb_{1-x}$ nitride. In another embodiment, the fourth primer layer 114 of the quadruple metal coating 34 comprises $W_xNb_{1-x}$ nitride. In another embodiment, the fourth primer layer 114 of the quadruple metal coating 34 comprises $W_xTi_{1-x}$ oxide. In another embodiment, the fourth primer layer 114 of the quadruple metal coating 34 comprises $Ti_xTa_{1-x}$ oxide. In another embodiment, the fourth primer layer 114 of the quadruple metal coating 34 comprises $Ti_xNb_{1-x}$ oxide. In another embodiment, the fourth primer layer 114 of the quadruple metal coating 34 comprises $Ti_xNb_{1-x}$ nitride. In another embodiment, the fourth primer layer 114 of the quadruple metal coating 34 comprises $Nb_xZr_{1-x}$ oxide. In another embodiment, the fourth primer layer 114 of the quadruple metal coating 34 comprises $Ta_xW_{1-x}$ oxide. In another embodiment, the fourth primer layer 114 of the quadruple metal coating 34 comprises $W_xNb_{1-x}$ oxide. In another embodiment, the fourth primer layer 114 of the quadruple metal coating 34 comprises $Zn_xTi_{1-x}$ oxide.

The fourth primer layer 114 has a total thickness in the range of 0.5 nm to 5 nm, preferably 1.0 nm to 2.5 nm, more preferably 1.5 nm to 2.5 nm.

A fifth dielectric layer 120 can be deposited over at least a portion of the fourth metallic layer 112 or the optional fourth primer layer 114. The fifth dielectric layer 120 can also include one or more materials discussed above with respect to the first, second, third, and fourth dielectric layers. In one non-limiting embodiment, the fifth dielectric layer 120 comprises a first film of the fifth dielectric layer 122. The first film of the fifth dielectric layer 122 comprises an oxide, a nitride, an oxynitride, or a mixture therefore of a metal selected from the group consisting of titanium, niobium, zinc, indium, tin, silicon, magnesium, gallium, vanadium, aluminum, alloys thereof, mixtures thereof, or combinations thereof. In one embodiment, the first film of the fifth dielectric layer 122 comprises zinc oxide or zinc stannate.

A second film of the fifth dielectric layer 124 can be deposited over at least a portion of the first film of the fifth dielectric layer 122. The second film of the fifth dielectric layer 124 comprises an oxide, a nitride, an oxynitride, or a mixture thereof of a metal selected from the group consisting of titanium, niobium, zinc, indium, tin, silicon, aluminum, alloys thereof, mixtures thereof, or combinations thereof. The second film of the fifth dielectric layer 124 can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one embodiment, the second film of the fifth dielectric layer 124 comprises zinc stannate or zinc oxide. In another embodiment, the second film of the fifth dielectric layer 124 comprises silicon nitride or silicon oxynitrides. In another embodiment, the second film of the fifth dielectric layer 124 comprises aluminum-doped zinc oxide. In another embodiment, the second film of the fifth dielectric layer 124 comprises indium-doped zinc oxide. In another embodiment, the second film of the fifth dielectric layer 124 comprises gallium-doped zinc oxide. In another embodiment, the second film of the fifth dielectric layer 124 comprises indium-doped tin oxide. In another embodiment, the first film of the fifth dielectric layer 124 comprises vanadium-doped zinc oxide.

An optional third film of the fifth dielectric layer can be deposited over at least a portion of the second film of the fifth dielectric layer 124. The optional third film of the fifth dielectric layer can comprise comprises an oxide, a nitride, an oxynitride, or a mixture therefore of a metal selected from the group consisting of titanium, niobium, zinc, indium, tin, silicon, magnesium, gallium, vanadium, aluminum, alloys thereof, mixtures thereof, or combinations thereof. The optional third film of the fifth dielectric layer can comprise aluminum-doped zinc oxide, gallium doped-zinc oxide, indium-doped zinc oxide, magnesium-doped zinc oxide, vanadium-doped zinc oxide, or indium-doped tin oxide, or mixtures thereof. In one non-limiting embodiment, the optional third film of the fifth dielectric layer comprises zinc oxide. In another embodiment, the optional third film of the fifth dielectric layer comprises silicon nitride or silicon oxynitrides. In another embodiment, the optional third film of the fifth dielectric layer comprises titanium oxide. In another embodiment, the optional third film of the fifth dielectric layer comprises aluminum-doped zinc oxide. In another embodiment, the optional third film of the fifth dielectric layer comprises indium-doped zinc oxide. In another embodiment, the optional third film of the fifth dielectric layer comprises gallium-doped zinc oxide. In another embodiment, the optional third film of the fifth dielectric layer comprises indium-doped tin oxide. In another embodiment, the optional third film of the fifth dielectric layer comprises vanadium-doped zinc oxide.

One non-limiting embodiment of the quadruple metal coating 34 is in which the first film of the fifth dielectric layer 122 comprises zinc oxide or zinc stannate, and the second film of the fifth dielectric layer 124 comprises zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide over at least a portion of the second film of the fifth dielectric layer 124.

The fifth dielectric layer 120 of the quadruple metal coating 34 can have a total thickness in the range of 10 nm to 45 nm, preferably 15 nm to 40 nm, more preferably 20 nm to 35 nm, most preferably 23 nm to 28 nm.

In one non-limiting embodiment, the coating 30 comprises a first, second, third, and fourth metallic layer. The metallic layers are continuous metallic layers. The metallic layers may include only silver or only silver and gold. Each metallic layer has a thickness. In one non-limiting embodiment, the total combined thickness of the metallic layers for the quadruple metal coating 34 is in the range of 10 nm to 60 nm, preferably 20 nm to 50 nm, most preferably 30 nm to 45 nm, most preferably 35 nm to 40 nm. In the event the primer layer comprises aluminum and zinc, the total thickness of the metallic layers for the quadruple metal coating 34 is in the range of 10 nm to 65 nm, preferably 20 nm to 60 nm, most preferably 40 nm to 55 nm, most preferably 35 nm to 45 nm.

The triple and quadruple metal coatings 33, 34 can include an outermost protective layer 200, which, for example in the non-limiting embodiments shown in FIGS. 4-7, is deposited over at least a portion of the fourth or fifth dielectric layer 100, 120, to assist in protecting the underlying layers, such as the metallic layers, from mechanical and chemical attack during processing. The outermost protective layer 200 can be an oxygen barrier coating layer to prevent or reduce the passage of ambient oxygen into the underlying layers of the coating, such as during heating or bending. The outermost protective layer 200 can be of any desired material or mixture of materials and can be comprised of one or more protective films. In one exemplary embodiment, the outermost protective layer 200 can include a single layer comprising one or more metal oxide materials, such as but not limited to oxides of aluminum, silicon, or mixtures thereof. For example, the outermost protective coating can be a single coating layer comprising in the range of 0 wt. % to 100 wt. % alumina and/or 100 wt. % to 0 wt. % silica, such as 5 wt. % to 95 wt. % alumina and 95 wt. % to 5 wt. % silica, such as 10 wt. % to 90 wt. % alumina and 90 wt. % to 10 wt. % silica, such as 15 wt. % to 90 wt. % alumina and 85 wt. % to 10 wt. % silica, such as 50 wt. % to 75 wt. % alumina and 50 wt. % to 25 wt. % silica, such as 50 wt. % to 70 wt. % alumina and 50 wt. % to 30 wt. % silica, such as 35 wt. % to 100 wt. % alumina and 65 wt. % to 0 wt. % silica, such as 70 wt. % to 90 wt. % alumina and 30 wt. % to 10 wt. % silica, e.g., 75 wt. % to 85 wt. % alumina and 25 wt. % to 15 wt. % silica, e.g., 88 wt. % alumina and 12 wt. % silica, e.g., 65 wt. % to 75 wt. % alumina and 35 wt. % to 25 wt. % silica, e.g., 70 wt. % alumina and 30 wt. % silica, e.g., 60 wt. % to less than 75 wt. % alumina and greater than 25 wt. % to 40 wt. % silica. Other materials, such as aluminum, chromium, hafnium, yttrium, nickel, boron, phosphorous, titanium, zirconium, and/or oxides thereof can also be present, such as to adjust the refractive index of the outermost protective layer 200. In one non-limiting embodiment, the refractive index of the outermost protective layer 200 can be in the range of 1 to 3, such as 1 to 2, such as 1.4 to 2, such as 1.4 to 1.8.

In one non-limiting embodiment, the outermost protective layer 200 is a combination silica and alumina coating. The outermost protective layer 200 can be sputtered from two cathodes (e.g., one silicon and one aluminum) or from a single cathode containing both silicon and aluminum. This silicon aluminum oxide outermost protective layer 200 can be written as $Si_xAl_{1-x}O_{(1.5+x)2}$, where x can vary from greater than 0 to less than 1. In one exemplary embodiment, the outermost protective layer 200 comprises 15 wt. % alumina and 85 wt. % silica. In another embodiment, the outermost protective layer 200 comprises $SiO_2$, $Al_2O_3$, SiAlO, alloys thereof, and mixtures thereof.

In one non-limiting embodiment, the outermost protective layer 200 may be comprised of silicon nitride ($Si_3N_4$), silicon oxynitride (SiON), silicon aluminum nitride (SiAlN), silicon aluminum oxynitride (SiAlON), a mixture thereof, and/or an alloy thereof and which may provide increased durability to the coated article. The outermost protective layer 200 may be formed of silicon nitride deposited with other materials having superior electrical conductivity to improve sputtering of the silicon. For example, during deposition, the silicon cathode can include a small amount (e.g., up to 20 wt. %, up to 15 wt. %, up to 10 wt. %, or up to 5 wt. %) of aluminum to improve sputtering. In which case, the resultant silicon nitride layer would include a small percentage of aluminum, e.g., up to 15 wt. % aluminum, e.g., up to 10 wt. % aluminum, e.g., up to 5 wt. % aluminum. A coating layer deposited from a silicon cathode having up to 10 wt. % aluminum (added to enhance the conductivity of the cathode) is referred to herein as a "silicon nitride" layer, even though a small amount of aluminum may be present. The small amount of aluminum in the cathode (e.g., less than or equal to 15 wt. %, such as less than or equal to 10 wt. %, such as less than or equal to 5 wt. %) is believed to form aluminum nitride in the predominately silicon nitride outermost protective layer 200. The outermost protective layer 200 may be formed in a nitrogen atmosphere; however, it is to be understood that other gasses, such as oxygen, may be present in the atmosphere during the deposition of the outermost protective layer 200.

In another non-limiting embodiment, the outermost protective layer 200 can be a multilayer coating comprising a first protective film 202 and a second protective film 204 formed over at least a portion of the first protective film 202. The first protective film 202 can comprise alumina, silica, titania, zirconia, tin oxide, alloys thereof, mixtures thereof, or combinations thereof. In one specific non-limiting embodiment, the first protective film 202 can comprise alumina or alloy comprising alumina and silica. For example, the first protective film 202 can comprise a silica/alumina mixture having greater than 5 wt. % alumina, such as greater than 10 wt. % alumina, such as greater than 15 wt. % alumina, such as 50 wt. % to 70 wt. % alumina, such as in the range of 60 wt. % to 100 wt. % alumina and 40 wt. % to 0 wt. % silica, e.g., 60 wt. % alumina and 40 wt. % silica. In another example, the first protective film 202 can comprise zinc stannate. In another example, the first protective film 202 can comprise zirconia.

The second protective film 204 may comprise, for example, a metal oxide or metal nitride. The second protective film 204 can be titania, alumina, silica, zirconia, tin oxide, a mixture thereof, or an alloy thereof. For example, the second protective film 204 can comprise a titania/alumina mixture having 40 wt. % to 60 wt. % alumina and 60 wt. % to 40 wt. % titania; 45 wt. % to 55 wt. % alumina and 55 wt. % to 45 wt. % titania; 48 wt. % to 52 wt. % alumina and 52 wt. % to 48 wt. % titania; 49 wt. % to 51 wt. % alumina and 51 wt. % to 49 wt. % titania; or 50 wt. % alumina and 50 wt. % titania. An example of the second protective film 204 may include titanium aluminum oxide (TiAlO). Another example of the second protective film 204 is a silica/alumina mixture having greater than 40 wt. % silica, such as greater than 50 wt. % silica, such as greater than 60 wt. % silica, such as greater than 70 wt. % silica, such as greater than 80 wt. % silica, such as in the range of 80 wt. % to 90 wt. % silica and 10 wt. % to 20 wt. % alumina, e.g., 85 wt. % silica and 15 wt. % alumina.

In non-limiting examples, the outermost protective layer 200 may include an additional third protective film formed over at least a portion of the second protective film 204. The third protective film can be any of the materials used to form the first and second protective films 202, 204. The third protective film, for example, can comprise alumina, silica, titania, zirconia, tin oxide, or mixtures thereof. For example, the third protective film can comprise a mixtures of silica and alumina. In another example, the third protective film comprises alumina and titania. In another example, the third protective film comprises zirconia.

The outermost protective layer 200 is the outermost layer of the coating. Further, the outermost protective layer 200 can be of non-uniform thickness. By "non-uniform thickness" is meant that the thickness of the outermost protective layer 200 can vary over a given unit area, e.g., the outermost protective layer can have high and low spots or areas. The outermost protective layer 200 can have a total thickness in the range of 20 nm to 120 nm, preferably 25 nm to 110 nm, more preferably 30 nm to 100 nm, most preferably 35 nm to 90 nm. Non-limiting examples of suitable protective layers are described in U.S. patent application Ser. Nos. 10/007,382; 10/133,805; 10/397,001; 10/422,095; and Ser. No. 10/422,096.

In some non-limiting embodiments, the coated article 30 further comprises a light absorber. The light absorber is selected from the group consisting of tint glass, PVB, an absorbing layer, or combinations thereof.

In the non-limiting embodiments described above, an additional optional absorbing layer 140 may be positioned over at least a portion of the fourth dielectric layer 100 of the triple metal coating 33 (FIG. 8) or over the fifth dielectric layer 120 of the quadruple metal coating 34 (FIG. 9), such that the absorbing layer 140 would be positioned between the fourth dielectric layer 100 and the optional outermost protective layer 200 or positioned between the fifth dielectric layer 120 and the optional outermost protective layer 200, or would be the outmost coating. The absorbing layer 140 is selected from the group consisting of Ge, $GeO_x$, $NbN_x$, $NbN_xO_y$, $Si_aAl_b$, $Si_aAl_bO_x$, $Si_aCo_b$, $Si_aCo_bO_x$, $Si_aCo_bCu_c$, $Si_aCo_bCu_cO_x$, $Si_aCr_b$, $Si_aCr_bO_x$, $Si_aNi_b$, $SiNiO_x$, $SiO_x$, $SnN_x$, $SnO_x$, $SnO_xN_y$, $TiN_x$, $Ti_aNb_bN_x$, $Ti_aNb_bO_x$, $Ti_aNb_bO_xN_y$, $TiO_xN_y$, $WO_x$, $WO_2$, ZnO:Co, ZnO:Fe, ZnO:Mn, ZnO:Ni, ZnO:V, ZnO:Cr, $Zn_aSn_b$, $Zn_aSn_bO_x$, or any combination thereof. In one non-limiting embodiment, the absorbing layer 140 comprises silicon cobalt oxide. The absorbing layer 140 can have a total thickness in the range of 1 nm to 40 nm, preferably 5 nm to 30 nm, more preferably 10 nm to 25 nm, most preferably 15 nm to 20 nm.

Alternatively, the absorbing layer 140 can comprise a subcritical metal film. The term "subcritical thickness" means a thickness below the critical thickness such that the coating material forms islanded, non-connected regions of the coating material. The term "islanded" means that the coating material is not a continuous layer, but rather, that the material is deposited to form isolated regions or islands. The metal in the subcritical metal film can comprise silver, gold, alloys thereof, mixtures thereof, or combinations thereof. In one non-limiting embodiment, the subcritical metal film comprises silver. The subcritical metal film can have a total subcritical thickness in the range of 0.5 nm to 20 nm, preferably 1 nm to 10 nm, more preferably 1.5 nm to 3.5 nm.

In another non-limiting embodiment, an optional additional dielectric layer 160 is formed over at least a portion of the subcritical metal film, such that the additional dielectric layer 160 would be positioned between the subcritical metal film and the optional outermost protective layer 200. The optional dielectric layer 160 can be a multilayer, as described above, comprising one or more dielectric films. The additional dielectric layer 160 can include one or more materials discussed above with respect to the first, second, third, fourth, and fifth dielectric layers 40, 60, 80, 100, 120. The optional additional dielectric layer 160 comprises a total thickness in the range of 25 nm to 33 nm, preferably 26 nm to 32 nm, more preferably 27 nm to 31 nm, most preferably 28 nm to 30 nm.

In some non-limiting embodiments, tinted glass cover plates or clear glass cover plates 12, 18 and/or a tinted PVB or an un-tinted PVB interlayer 24 can be utilized in attempt to match the three requirements, i.e., neutral color of Rf, low Rf and Rg of approximately 8%, and a LTA value of no less than 70% for forward vision areas of a vehicle.

In one non-limiting practice of the invention, the thickness and/or number of silver layers is configured to give a total resistivity (sheet resistance) for the coating of in the range of 0.6 to 1.5 ohms per square ($\Omega/\square$), preferably 0.6 to 1.0$\Omega/\square$, more preferably 0.6 to 0.9$\Omega/\square$. However, it will also be appreciated by one skilled in the art, as the number or thickness of silver metallic layers increases, the visible light transmittance decreases. The thickness and/or number of metallic layers should not be increased to a point where visible light transmittance of the vision area falls below about 70%. Additionally, if the total silver thickness is too thick, the color of the glass will appear red, which is undesirable.

In one non-limiting practice of the invention, the coating provides a visible light reflectance of not more than 25%. For example, not more than 20%, such as no more than 10%, such as not more than 8%.

In one non-limiting practice of the invention, the coating 30 provides an exterior (ext) reflected a* at an 8 degree angle (°) (Rg8a*) in the range of 1 to −2. For example, in the range of 1 to −1, preferably −0.5 to 0.5, more preferably −0.5 to 0, most preferably 0.

In one non-limiting practice of the invention, the coating 30 provides an exterior reflected b* at 8° (Rg8b*) in the range of 1 to −2. For example, in the range of 1 to −1, preferably −0.5 to 0.5, more preferably −0.5 to 0, most preferably 0.

The invention is further described in the following numbered clauses:

Clause 1: A coated article comprising a substrate comprising a first surface and second surface opposite the first surface; a functional coating applied over the surface, the functional coating comprising a first dielectric layer over at least a portion of the surface; a first metallic layer over at least a portion of the first dielectric layer; a second dielectric layer over at least a portion of the first metallic layer; a second metallic layer over at least a portion of the second dielectric layer; a third dielectric layer over at least a portion of the second metallic layer; a third metallic layer over at least a portion of the third dielectric layer; and a fourth dielectric layer over at least a portion of the third metallic layer, wherein a total combined thickness of the metallic layers is at least 10 nanometers, and no more than 60 nanometers.

Clause 2: The coated article of clause 1, wherein the total combined thickness of the metallic layers is at least 20 nm, and no more than 40 nanometers.

Clause 3: The coated article of clause 1 wherein the total combined thickness of the metallic layers is at least 25 nm, and no more than 31 nanometers.

Clause 4: The coated article of any of the preceding clauses, wherein the coated article has a visible light reflectance of not more than 8%.

Clause 5: The coated article of any of the preceding clauses, wherein the coated article has a visible light transmittance of at least 70%.

Clause 6: The coated article of any of the preceding clauses, wherein at least one of the metallic layers comprises at least one of silver, gold, alloys thereof, mixtures thereof, or combinations thereof.

Clause 7: The coated article of clause 6, wherein at least one of the metallic layers is silver.

Clause 8: The coated article of any of the preceding clauses, wherein at least one of the metallic layers is a continuous layer.

Clause 9: The coated article of any of the preceding clauses, wherein the first metallic layer comprises a total thickness of 5 nm to 20 nm, preferably 5 nm to 17.5 nm, more preferably 7 nm to 15 nm, or most preferably 8 nm to 10.5 nm.

Clause 10: The coated article of any of the preceding clauses, wherein the second metallic layer comprises a total thickness of 5 nm to 20 nm, preferably 5 nm to 15 nm, more preferably 7.5 nm to 12.5 nm, or most preferably 8.5 nm to 11.5 nm.

Clause 11: The coated article of any of the preceding clauses, wherein the third metallic layer comprises a total thickness of 1 nm to 20 nm, preferably 5 nm to 20 nm, more preferably 7.5 nm to 15 nm, or most preferably 7.5 nm to 10.5 nm.

Clause 12: The coated article of any of the preceding clauses, further comprising at least one primer layer formed over at least one of the metallic layers.

Clause 13: The coated article of clause 12, wherein the at least one primer layer is selected from a group consisting of zinc, aluminum, vanadium, tungsten, tantalum, niobium, zirconium, manganese, chromium, tin, nickel, germanium, magnesium, molybdenum, silver, silicon carbon, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof, and wherein the primer is deposited as a metal and subsequently oxidized.

Clause 14: The coated article of clause 12 or 13, wherein when the at least one primer layer comprises aluminum and zinc, the total thickness of the metallic layers is in the range of 10 nm to 65 nm, preferably 15 nm to 55 nm, more preferably 20 nm to 45 nm, or most preferably 25 nm to 36 nm.

Clause 15: The coated article of clause 12 or 13, wherein the at least one primer layer comprises a total thickness of 0.5 nm to 5 nm, preferably 1 nm to 2.5 nm, or more preferably 1.5 nm to 2.5 nm.

Clause 16: The coated article any of the preceding clauses, wherein at least one of the dielectric layers comprise zinc stannate, zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide.

Clause 17: The coated article of any of the preceding clauses, wherein the first dielectric layer comprises a first film comprising zinc stannate over at least a portion of the substrate, and a second film comprising zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, mixtures thereof, or combinations thereof over at least a portion of the first film.

Clause 18: The coated article of clause 17, wherein the second film comprises aluminum-doped zinc oxide, gallium doped-zinc oxide, indium-doped zinc oxide, magnesium-doped zinc oxide, vanadium-doped zinc oxide, or indium-doped tin oxide, mixtures thereof, or combinations thereof.

Clause 19: The coated article of clauses 17 to 18, wherein the first dielectric layer comprises a total thickness of 10 nm to 50 nm, preferably 12 nm to 45 nm, more preferably 15 nm to 42 nm, or most preferably 18 nm to 40 nm.

Clause 20: The coated article of any of the preceding clauses, wherein a first dielectric layer comprises a seed film in direct contact with the first metallic layer, wherein the seed film can comprise aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof.

Clause 21: The coated article of any of the preceding clauses, wherein the second dielectric layer comprises a first film comprising zinc oxide over at least a portion of the first primer layer, and a second film comprising zinc stannate over at least a portion of the first film, and a third film comprising zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, mixtures thereof, or combinations thereof over at least a portion of the second film.

Clause 22: The coated article of clause 21, wherein the second dielectric layer comprises a total thickness of 40 nm to 110 nm, preferably 50 nm to 100 nm, more preferably 55 nm to 80 nm, or most preferably 67 nm to 76 nm.

Clause 23: The coated article of any of the preceding clauses, wherein a second dielectric layer comprises a seed film in direct contact with the second metallic layer, wherein the seed film comprises aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof.

Clause 24: The coated article of any of the preceding clauses, wherein the third dielectric layer comprises a first film comprising zinc oxide or zinc stannate over at least a portion of the second primer layer, and a second film comprising zinc stannate or zinc oxide over at least a portion of the first film, and a third film comprising zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, mixtures thereof, or combinations thereof over at least a portion of the second film.

Clause 25: The coated article of clause 24, wherein the third dielectric layer comprises a total thickness of 40 nm to 110 nm, preferably 50 nm to 100 nm, more preferably 65 nm to 80 nm, or most preferably 71 nm to 75 nm.

Clause 26: The coated article of any of the preceding clauses, wherein the third dielectric comprises a seed film in direct contact with the third metallic layer wherein the seed film can comprise aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof.

Clause 27: The coated article of any of the preceding clauses, wherein the fourth dielectric layer comprises a first film comprising zinc oxide or zinc stannate over at least a portion of the third primer layer, and a second film comprising zinc stannate or zinc oxide over at least a portion of the first film, and a third film comprising zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide, or combinations thereof over at least a portion of the second film.

Clause 28: The coated article of clause 27, wherein the fourth dielectric layer comprises a total thickness of 10 nm to 50 nm, preferably 15 nm to 40 nm, more preferably 20 nm to 35 nm, or most preferably 27 nm to 31 nm.

Clause 29: The coated article of any of the preceding clauses, further comprising an outermost protective coating comprising a protective layer, where in the protective layer comprises at least one of $Si_3N_4$, SiAlN, SiAlON, titania, alumina, silica, zirconia, alloys thereof, mixtures thereof, or combinations thereof.

Clause 30: The coated article of clause 29, wherein the outermost protective layer comprises a total thickness of 15 nm to 120 nm, preferably 25 nm to 110 nm, more preferably 30 nm to 100 nm, or most preferably 20 nm to 90 nm.

Clause 31: The coated article of any of clauses 29 to 30, wherein the outermost protective layer comprises a first protective film and a second protective film formed over the first protective film.

Clause 32: The coated article of clause 29 to 31, wherein the outermost protective layer comprises silicon aluminum oxide, titanium aluminum oxide, mixtures thereof, or combinations thereof.

Clause 33: The coated article any of the preceding clauses, further comprising a light absorber selected from the group consisting of tint glass, polyvinyl butyral ("PVB"), absorbing layer, or combinations thereof.

Clause 34: The coated article of clause 33, wherein an absorbing layer is formed over at least a portion of the fourth dielectric layer.

Clause 35: The coated article of clause 34, wherein the absorbing layer is selected from a group consisting of Ge, $GeO_x$, $NbN_x$, $NbN_xO_y$, $Si_aAl_b$, $Si_aAl_bO_x$, $Si_aCo_b$, $Si_aCo_bO_x$, $Si_aCo_bCu_c$, $Si_aCo_bCu_cO_x$, $Si_aCr_b$, $Si_aCr_bO_x$, $Si_aNi_b$, $SiNiO_x$, $SiO_x$, $SnN_x$, $SnO_x$, $SnO_xN_y$, $TiN_x$, $Ti_aNb_bN_x$, $Ti_aNb_bO_x$, $Ti_aNb_bO_xN_y$, $TiO_xN_y$, $WO_x$, $WO_2$, ZnO:Co, ZnO:Fe, ZnO:Mn, ZnO:Ni, ZnO:V, ZnO:Cr, $Zn_aSn_b$, $Zn_aSn_bO_x$, or any combination thereof.

Clause 36: The coated article of clause 35, wherein the absorbing layer comprises silicon cobalt oxide.

Clause 37: The coated article of any of clauses 35 to 36, wherein the absorbing layer comprises a total thickness of 1 nm to 40 nm, preferably 5 nm to 30 nm, more preferably 10 nm to 25 nm, or most preferably 15 nm to 20 nm.

Clause 38: The coated article of clause 34, wherein the absorbing layer is a subcritical metal film.

Clause 39: The coated article of clause 38, wherein the subcritical metal film comprises silver, gold, alloys thereof, mixtures thereof, or combination thereof.

Clause 40: The coated article of any of clauses 38 to 39, wherein the subcritical metal film comprises silver.

Clause 41: The coated article of any of clauses 38 to 40, wherein the subcritical metal film comprises a total thickness of 0.5 nm to 20 nm, preferably 1 nm to 10 nm, or more preferably 1.5 nm to 3.5 nm.

Clause 42: The coated article of clause 38 wherein an additional dielectric layer is formed over at least a portion of the subcritical metal film.

Clause 43: The coated article of clause 42, wherein the additional dielectric layer formed over at least a portion of the subcritical metal film comprises zinc stannate, zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide.

Clause 44: The coated article of any of clauses 42 to 43, wherein an additional dielectric layer formed over at least a portion of the subcritical metal film comprises a total thickness in the range of 25 nm to 33 nm, preferably 26 nm to 32 nm, more preferably 27 nm to 31 nm, most preferably 28 nm to 30 nm.

Clause 45: A coated article comprising a substrate comprising a first surface and second surface opposite the first surface; a functional coating applied over the surface, the functional coating comprising a first dielectric layer over at least a portion of the surface; a first metallic layer over at least a portion of the first dielectric layer; a second dielectric layer over at least a portion of the first metallic layer; a second metallic layer over at least a portion of the second dielectric layer; a third dielectric layer over at least a portion of the second metallic layer; a third metallic layer over at least a portion of the third dielectric layer; a fourth dielectric layer over at least a portion of the third metallic layer; a fourth metallic layer over at least a portion of the fourth dielectric layer; and a fifth dielectric layer over at least a portion of the fourth metallic layer, wherein a total combined thickness of the metallic layers is at least 10 nanometers, and no more than 60 nanometers.

Clause 46: The coated article of clause 45, wherein the total combined thickness of the metallic layers is at least 30 nm, and no more than 45 nanometers.

Clause 47: The coated article of any of clauses 45, wherein the total combined thickness of the metallic layers is at least 35 nm, and no more than 40 nanometers.

Clause 48: The coated article of any of clauses 45 to 47, wherein the coated article has a visible light reflectance of not more than 8%.

Clause 49: The coated article of any of clauses 45 to 48, wherein the coated article has a visible light transmittance of at least 70%.

Clause 50: The coated article of any of clauses 45 to 49, wherein at least one of the metallic layers comprises at least one of silver, gold, alloys thereof, mixtures thereof, or combinations thereof.

Clause 51: The coated article of any of clauses 45 to 50, wherein at least one of the metallic layers is silver.

Clause 52: The coated article of any of clauses 45 to 51, wherein at least one of the metallic layers is a continuous layer.

Clause 53: The coated article of any of clauses 45 to 52, wherein the first metallic layer comprises a total thickness of 2 nm to 20 nm, preferably 6 nm to 18 nm, more preferably 9 nm to 12 nm, or most preferably 9.5 nm to 10 nm.

Clause 54: The coated article of any of clauses 45 to 53, wherein the second metallic layer comprises a total thickness of 2 nm to 20 nm, preferably 6 nm to 18 nm, more preferably 8 nm to 15 nm, or most preferably 9 nm to 12 nm.

Clause 55: The coated article of any of clauses 45 to 54, wherein the third metallic layer comprises a total thickness of 2 nm to 20 nm, preferably 6 nm to 18 nm, more preferably 8 nm to 15 nm, or most preferably 9 nm to 12 nm.

Clause 56: The coated article of any of clauses 45 to 47, wherein the fourth metallic layer comprises a total thickness of 2 nm to 20 nm, preferably 4 nm to 15 nm, more preferably 6 nm to 11 nm, or most preferably 7 nm to 10 nm.

Clause 57: The coated article of any of clauses 45 to 56, further comprising at least one primer layer formed over at least one of the metallic layers.

Clause 58: The coated article of clause 57, wherein one of the at least one primer layer is selected from a group consisting of zinc, aluminum, vanadium, tungsten, tantalum, niobium, zirconium, manganese, chromium, tin, nickel, germanium, magnesium, molybdenum, silver, silicon carbon, aluminum-doped silver, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof, or alloys thereof, and wherein the primer is deposited as a metal and subsequently oxidized.

Clause 59: The coated article of 57 or 58, wherein when the at least one primer layer comprises aluminum and zinc, the total thickness of the metallic layers is in the range of 10 nm to 65 nm, preferably 20 nm to 60 nm, most preferably 40 nm to 55 nm, most preferably 35 nm to 45 nm.

Clause 60: The coated article any of clauses 45 to 59, wherein at least one of the dielectric layers comprise zinc stannate, zinc oxide, silicon nitride, aluminum-doped zinc oxide, gallium doped-zinc oxide, indium-doped zinc oxide, magnesium-doped zinc oxide, vanadium-doped zinc oxide, or indium-doped tin oxide.

Clause 61: The coated article of any of clauses 45 to 60, wherein the first dielectric layer comprises a total thickness of 20 nm to 55 nm, preferably 25 nm to 50 nm, more preferably 30 nm to 45 nm, or most preferably 35 nm to 40 nm.

Clause 62: The coated article of any of clauses 45 to 61, wherein the second dielectric layer comprises a total thickness of 60 nm to 100 nm, preferably 65 nm to 95 nm, more preferably 70 nm to 90 nm, or more preferably 74 nm to 80 nm.

Clause 63: The coated article of any of clauses 45 to 62, wherein the third dielectric layer comprises a total thickness of 55 nm to 90 nm, preferably 60 nm to 85 nm, more preferably 68 nm to 80 nm, or most preferably 70 nm to 75 nm.

Clause 64: The coated article of any of clauses 45 to 63, wherein the fourth dielectric layer comprises a seed film in direct contact with the fourth metallic layer, wherein the seed film can comprise aluminum, aluminum silver, aluminum zinc, zinc, zinc tin, germanium, nickel, magnesium, silicon carbide, aluminum nitride, indium zinc, vanadium zinc, gallium zinc, indium tin, niobium, zirconium, tantalum, molybdenum, aluminum-doped silver, silver, silver zinc, titanium aluminum, alloys thereof, mixtures thereof, oxides thereof, sub-oxides thereof, nitrides thereof, sub-nitrides thereof, or combinations thereof.

Clause 65: The coated article of clause 64, wherein the fourth dielectric layer comprises a total thickness of 45 nm to 80 nm, preferably 50 nm to 75 nm, more preferably 55 nm to 70 nm, or most preferably 60 nm to 65 nm.

Clause 66: The coated article of any of clauses 45 to 65, wherein the fifth dielectric comprises a first film comprising zinc oxide or zinc stannate formed over at least a portion of the fourth primer layer, and a second film comprising zinc oxide, zinc stannate, silicon nitride, aluminum-doped zinc oxide, gallium doped-zinc oxide, indium-doped zinc oxide, magnesium-doped zinc oxide, vanadium-doped zinc oxide, or indium-doped tin oxide, mixtures thereof, or combinations thereof over at least a portion of the first film.

Clause 67: The coated article of clause 66, wherein the fifth dielectric layer comprises a total thickness of 10 nm to 45 nm, preferably 15 nm to 40 nm, more preferably 20 nm to 35 nm, or most preferably 23 nm to 28 nm.

Clause 68: The coated article of any of clauses 45 to 67, further comprising an outermost protective coating comprising a protective layer, wherein the protective layer comprises at least one of $Si_3N_4$, SiAlN, SiAlON, titania, alumina, silica, zirconia, alloys thereof, or mixtures thereof.

Clause 69: The coated article of clause 68, wherein the outermost protective layer comprises a first protective film and a second protective film formed over the first protective film.

Clause 70: The coated article of any of clauses 68 to 69, wherein the outermost protective layer comprises protective films of silicon aluminum oxide or titanium aluminum oxide.

Clause 71: The coated article of any of clauses 45 to 70, further comprising a light absorber selected from the group consisting of tint glass, PVB, absorbing layer, or combinations thereof.

Clause 72: The coated article of clause 71, further comprising an absorbing layer formed over at least a portion of the fifth dielectric layer.

Clause 73: The coated article of clause 72, wherein the absorbing layer is selected from a group consisting of Ge, $GeO_x$, $NbN_x$, $NbN_xO_y$, $Si_aAl_b$, $Si_aAl_bO_x$, $Si_aCo_b$, $Si_aCo_bO_x$, $Si_aCo_bCu_c$, $Si_aCo_bCu_cO_x$, $Si_aCr_b$, $Si_aCr_bO_x$, $Si_aNi_b$, $SiNiO_x$, $SiO_x$, $SnN_x$, $SnO_x$, $SnO_xN_y$, $TiN_x$, $Ti_aNb_bN_x$, $Ti_aNb_bO_x$, $Ti_aNb_bO_xN_y$, $TiO_xN_y$, $WO_x$, $WO_2$, ZnO:Co, ZnO:Fe, ZnO:Mn, ZnO:Ni, ZnO:V, ZnO:Cr, $Zn_aSn_b$, $Zn_aSn_bO_x$, or any combination thereof Clause 74: The coated article of clauses 73, wherein the absorbing layer comprises silicon cobalt oxide.

Clause 75: The coated article of clause 72, wherein the absorbing layer is a subcritical metal film.

Clause 76: The coated article of clause 75, wherein the subcritical metal film comprises silver, gold, alloys thereof, mixtures thereof, or combination thereof.

Clause 77: The coated article of any of clauses 75 to 76, wherein the subcritical metal film comprises silver.

Clause 78: The coated article of any of clauses 75 to 77, wherein an additional dielectric layer is formed over at least a portion of the subcritical metal film.

Clause 80: A method of making a coated article comprising: providing a substrate comprising a first surface and second surface opposite the first surface; and applying a functional coating over at least a portion of the surface, the applying the functional coating step comprising: forming a first dielectric layer over at least a portion of the surface; forming a first metallic layer over at least a portion of the first dielectric layer; forming a second dielectric layer over at least a portion of the first metallic layer; forming a second metallic layer over at least a portion of the second dielectric layer; forming a third dielectric layer over at least a portion of the second metallic layer; forming a third metallic layer over at least a portion of the third dielectric layer; and forming a fourth dielectric layer over at least a portion of the third metallic layer, wherein a total combined thickness of the metallic layers is at least 10 nanometers, and no more than 60 nanometers.

Clause 81: The method of clause 80, wherein the applying the functional coating step further comprises forming a fourth metallic layer over at least a portion of the fourth dielectric layer, and forming a fifth dielectric layer over at least a portion of the fourth metallic layer, wherein the overcoat is over at least a portion of the fifth dielectric layer.

Clause 82: The method of clauses 80-81, further applying a outermost protective coating, the applying the outermost protective coating step comprising forming an outermost protective layer comprising a protective layer, wherein the protective layer comprises at least one of $Si_3N_4$, SiAlN, SiAlON, titania, alumina, silica, or zirconia.

EXAMPLES

The following Examples illustrate various embodiments of the invention. However, it is to be understood that the invention is not limited to these specific embodiments.

Example 1

Table 3 shows exemplary coating compositions and thicknesses of the triple metal coating of the present invention. The reported thicknesses are geometric thicknesses in nanometers (nm), unless otherwise noted. The substrate is a clear glass substrate with a thickness of 2.1 mm and a 1.6 mm clear cover positioned over the substrate. A 0.7 mm PVB interlayer is utilized. The base layer is the first dielectric layer, the base center layer is the second dielectric layer, the top center layer is the third dielectric layer, and the top layer is the fourth dielectric layer.

TABLE 3

| Sample | 1 |
|---|---|
| Interlayer | 0.7 mm PVB |
| Substrate | Glass 2.1 mm |
| Cover | Clear 1.6 mm |
| Base | 30.6 |
| 1$^{st}$ Metallic Layer | 8.51 |
| Base Center | 75.8 |
| 2$^{nd}$ Metallic Layer | 8.53 |

TABLE 3-continued

| Sample | 1 |
|---|---|
| Top Center | 71.7 |
| 3rd Metallic Layer | 7.64 |
| Top | 27.4 |
| 1$^{st}$ Protective Film | 20.0 |
| 2$^{nd}$ Protective Film | 35.0 |
| Total Metallic | 24.7 |

Tables 4 and 5 show the resulting color and optical properties, respectively for the samples of Table 3.

TABLE 4

| Sample | Angle | Rg a* | Rg b* | Rg L* | Rf a* | Rf b* | Rf L* | Rf 400 | Rf 700 |
|---|---|---|---|---|---|---|---|---|---|
| 1 | 8° | −0.48 | −0.09 | 32.77 | 0.66 | −0.50 | 32.47 | 4.87 | 7.30 |
|   | 44° | −1.10 | 0.33 | 35.33 | −0.63 | 0.78 | 35.19 | — | — |
|   | 60° | −1.67 | 0.91 | 44.51 | −1.67 | 1.50 | 44.46 | 9.69 | 16.82 |

TABLE 5

| Sample | LTA | T L* | T a* | T b* | T solar | R1 solar | R2 solar | Resistance (Ω/□) | Solar Factor (TTs) |
|---|---|---|---|---|---|---|---|---|---|
| 1 | 78.75 | 91.12 | −2.39 | 3.55 | 44.02 | 28.54 | 30.96 | 1.45 | 0.49 |

Example 2

The solar factor (TTs), or the total transmitted energy of solar radiation, was higher than desired (49-50%) for the triple metal coatings of Example 1. The high TTs value indicated that approximately 50% of solar radiation energy is transmitted through the substrate, leading to undesired heat production. Table 6 shows exemplary coating compositions and thicknesses (nm) of the triple metal coating of the present invention, wherein a tinted cover was utilized in an attempt to reduce the transmitted solar radiation, while matching the three property requirements (neutral Rf color, low Rf and Rg (8%), and LTA of no less than 70%). Solex, Atlantica SGN-C4, Caribia, Azuria, and Tintes-P-L are greener than clear glass and are therefore more absorptive.

TABLE 6

| Sample | 2 | 3 | 4 | 5 | 6 |
|---|---|---|---|---|---|
| Substrate | 2.1 mm Glass | | | | |
| Cover | Solex | Atlantica SGN-C4 | Caribia | Azuria | Tintex-P-L |
| Interlayer | 0.7 mm clear PVB | | | | |
| Base Layer | 18.6 | 18.6 | 18.6 | 18.6 | 21.8 |
| 1$^{st}$ Metallic Layer | 8.43 | 8.43 | 8.43 | 8.43 | 8.76 |
| Base Center Layer | 67.2 | 67.0 | 67.2 | 67.2 | 68.1 |
| 2$^{nd}$ Metallic Layer | 8.89 | 8.89 | 8.89 | 8.89 | 8.83 |
| Top Center Layer | 74.8 | 74.6 | 74.8 | 74.8 | 73.9 |
| 3$^{rd}$ Metallic Layer | 8.09 | 8.09 | 8.09 | 8.09 | 7.62 |

TABLE 6-continued

| Sample | 2 | 3 | 4 | 5 | 6 |
|---|---|---|---|---|---|
| Top Layer | 31.3 | 31.3 | 31.3 | 31.3 | 29.8 |
| 1st Protective Film | 20.0 | 20.0 | 20.0 | 20.0 | 20.0 |
| 2nd Protective Film | 35.0 | 35.0 | 35.0 | 35.0 | 35.0 |
| Total Metallic | 25.4 | 25.4 | 25.4 | 25.4 | 25.2 |

Tables 7 and 8 show the resulting color and optical properties, respectively, for the samples of Table 6.

TABLE 7

| Sample | Angle | Rg a* | Rg b* | Rg L* | Rf a* | Rf b* | Rf L* | Rf 400 | Rf 700 |
|---|---|---|---|---|---|---|---|---|---|
| 2 | 8° | 0.30 | −1.30 | 34.34 | 0.61 | −0.70 | 33.47 | 5.26 | 7.93 |
|   | 45° | −0.57 | 0.15 | 36.62 | −1.07 | 0.97 | 35.89 | — | — |
|   | 60° | −1.12 | 0.95 | 45.01 | −2.26 | 1.59 | 44.46 | 10.06 | 16.52 |
| 3 | 8° | 0.10 | −1.12 | 34.26 | 0.29 | −0.55 | 33.46 | 5.50 | 7.77 |
|   | 45° | −0.69 | 0.32 | 36.52 | −1.28 | 1.00 | 35.84 | — | — |
|   | 60° | −1.20 | 1.15 | 44.84 | −2.38 | 1.65 | 44.34 | 10.35 | 15.96 |
| 4 | 8° | −0.06 | −1.41 | 34.73 | 0.25 | −1.02 | 34.23 | 5.83 | 7.82 |
|   | 45° | −0.90 | 0.00 | 36.93 | −1.34 | 0.54 | 36.55 | — | — |
|   | 60° | −1.41 | 0.76 | 45.11 | −2.47 | 1.17 | 44.86 | 10.68 | 15.66 |
| 5 | 8° | −0.01 | −2.10 | 34.42 | 0.30 | −1.98 | 33.69 | 5.75 | 7.42 |
|   | 45° | −0.87 | −0.68 | 36.67 | −1.39 | −0.34 | 36.06 | — | — |
|   | 60° | −1.41 | 0.11 | 44.97 | −2.59 | 0.38 | 44.53 | 10.57 | 15.09 |
| 6 | 8° | 0.43 | −1.25 | 34.02 | 0.49 | −0.75 | 33.71 | 5.65 | 8.18 |
|   | 45° | 0.38 | −0.01 | 36.45 | −0.60 | 0.57 | 36.19 | — | — |
|   | 60° | −0.40 | 0.98 | 44.90 | −1.85 | 1.32 | 44.66 | 10.61 | 16.17 |

TABLE 8

| Sample | T LTA | T a* | T b* | T L* | R1 solar | R2 solar | T solar | Resistance (Ω/□) | Solar Factor (TTs) |
|---|---|---|---|---|---|---|---|---|---|
| 2 | 72.36 | −4.78 | 3.88 | 88.42 | 36.59 | 16.28 | 34.38 | 1.40 | 0.42 |
| 3 | 70.86 | −5.27 | 4.80 | 87.68 | 35.27 | 15.08 | 34.40 | 1.40 | 0.41 |
| 4 | 70.29 | −5.53 | 3.25 | 87.56 | 34.82 | 13.81 | 34.45 | 1.40 | 0.41 |
| 5 | 70.60 | −5.72 | 1.77 | 87.86 | 34.96 | 13.01 | 34.39 | 1.40 | 0.41 |
| 6 | 71.45 | −5.18 | 4.34 | 87.99 | 35.95 | 15.77 | 34.08 | 1.41 | 0.42 |

Example 3

Table 9 shows exemplary coating compositions and thicknesses (nm) of the triple metal coating of the present invention, wherein a silicon cobalt oxide ($SiCoO_x$) or subcritical metal film absorbing layer was added to the coating. The $SiCoO_x$ absorbing layer of sample 7 was positioned between the fourth dielectric layer and the first protective film of the outermost protective layer. The subcritical metal film, comprising silver, of sample 8 was positioned between the fourth dielectric layer and the previously described additional dielectric layer. An absorbing layer was utilized in conjunction with a tinted glass cover in an attempt to further reduce the transmitted solar radiation, while matching the three property requirements (neutral Rf color, low Rf and Rg (8%), and LTA of no less than 70%).

TABLE 9

| Sample | 7 | 8 |
|---|---|---|
| Substrate | Glass 2.1 mm | |
| Cover | Solex 1.6 mm | |
| Interlayer | Clear PVB 0.7 mm | |
| Base Layer | 30.1 | 34.2 |
| 1st Metallic Layer | 9.76 | 9.11 |
| Base Center Layer | 76.1 | 71.2 |
| 2nd Metallic Layer | 9.27 | 9.66 |
| Top Center Layer | 72.9 | 73.5 |
| 3rd Metallic Layer | 7.95 | 8.22 |
| Top Layer | 27.4 | 28.5 |
| Light absorber | $SiCoO_x$ | Subcritical Ag |
|   | 16.1 | 2.80 |
| Additional Dielectric | — | 29.8 |
| 1st Protective Film | 20.0 | 16.0 |
| 2nd Protective Film | 35.0 | 22.0 |
| Total Metallic | 27.0 | 29.8 |

Tables 10 and 11 show the resulting color and optical properties, respectively, for the samples of Table 9.

TABLE 10

| Sample | Angle | Rg a* | Rg b* | Rg L* | Rf a* | Rf b* | Rf L* | Rf 400 | Rf 700 |
|---|---|---|---|---|---|---|---|---|---|
| 7 | 8° | −0.67 | 0.33 | 34.31 | 0.29 | −0.66 | 33.23 | 5.31 | 7.62 |
|   | 45° | −2.19 | 1.29 | 36.42 | −1.23 | 0.91 | 35.61 | — | — |
|   | 60° | −2.46 | 1.68 | 44.86 | −2.29 | 1.75 | 44.32 | 10.09 | 16.66 |
| 8 | 8° | −0.48 | −1.56 | 33.27 | −0.24 | −1.20 | 32.61 | 5.14 | 8.41 |
|   | 45° | −0.85 | −0.38 | 35.66 | −0.73 | −0.03 | 35.18 | — | — |
|   | 60° | −1.23 | 0.48 | 44.35 | −1.68 | 0.75 | 43.99 | 10.04 | 17.22 |

TABLE 11

| Sample | T LTA | T a* | T b* | T L* | R1 solar | R2 solar | T solar | Resistance (Ω/□) | Solar Factor (TTs) |
|---|---|---|---|---|---|---|---|---|---|
| 7 | 71.92 | −3.77 | 4.27 | 88.05 | 36.88 | 18.80 | 34.22 | 1.30 | 0.43 |
| 8 | 71.80 | −4.11 | 3.02 | 88.14 | 36.58 | 18.86 | 33.85 | 1.15 | 0.43 |

Example 4

Table 12 shows an exemplary laminate composition of a triple metal coating, wherein a clear or tinted PVB interlayer is utilized in conjunction with a tinted or clear glass cover and glass substrate. The triple metal coating utilized is described above in Example 1, Table 3.

TABLE 12

| Sample | 9 | 10 | 11 | 12 | 13 |
|---|---|---|---|---|---|
| Substrate (ext) | 2.1 mm clear glass | | | | |
| Coating | Triple metal coating of Example 1 | | | | |
| PVB interlayer | 0.76 mm RB41 Clear | 0.76 mm RB41 Clear | 0.76 mm RB41 Clear | 0.76 mm RB41 Clear | 0.76 mm Sekisui Vision SCF2 |
| Glass cover (int) | 1.6 mm TSANX – SGG | 1.6 mm SGN-C5 | 1.6 mm SGN-C4 | 1.6 mm TSA3 + SGG | 1.6 mm Clear |

Table 13 shows the color and optical properties of triple metal coatings on a clear glass substrate with tinted or un-tinted PVB and a tinted or un-tinted glass cover.

TABLE 13

| | | R (Ext) | | | | | R (Int) | | | | Solar |
|---|---|---|---|---|---|---|---|---|---|---|---|
| Sample | LTA | R | a* | b* | R 400 | R 700 | R | a* | b* | R 400 | R 700 | Factor (TTs) |
| 9 | 72.37 | 7.21 | −0.97 | 0.99 | 7.02 | 7.24 | 7.06 | −0.72 | 0.78 | 4.90 | 6.65 | 0.47 |
| 10 | 71.51 | 7.17 | −1.11 | 0.95 | 7.02 | 7.10 | 7.01 | −0.88 | 0.73 | 4.89 | 6.43 | 0.46 |
| 11 | 70.45 | 7.09 | −1.18 | 1.11 | 7.00 | 7.02 | 6.93 | −0.98 | 0.92 | 4.86 | 6.30 | 0.45 |
| 12 | 70.14 | 7.07 | −1.19 | 1.09 | 7.00 | 7.01 | 6.91 | −0.99 | 0.89 | 4.86 | 6.28 | 0.45 |
| 13 | 72.51 | 7.30 | −1.57 | 2.48 | 6.75 | 6.69 | 7.19 | −1.37 | 2.39 | 4.61 | 5.85 | 0.44 |

Example 5

Table 14 shows exemplary coating compositions and thicknesses (nm) of the quadruple metal coating of the present invention. Here, the base layer is the first dielectric layer, the base center layer is the second dielectric layer, the center layer is the third dielectric layer, the top center layer is the fourth dielectric layer, and the top layer is the fifth dielectric layer. The quadruple metal coating was utilized in an attempt to further reduce the transmitted solar radiation, while matching the three property requirements (neutral Rf color, low Rf and Rg (8%), and LTA of no less than 70%).

TABLE 14

| Sample | 14 |
|---|---|
| Substrate | Glass 2.1 mm |
| Cover | Clear 1.6 mm |
| Interlayer | Clear PVB 0.7 mm |
| Base Layer | 37.4 |
| 1st Metallic Layer | 9.86 |
| Base Center Layer | 76.7 |
| 2nd Metallic Layer | 10.8 |
| Center Layer | 72.2 |
| 3rd Metallic Layer | 9.68 |
| Top Center Layer | 62.4 |
| 4th Metallic Layer | 7.91 |
| Top Layer | 25.5 |
| 1st Protective Film | 16.0 |
| 2nd Protective Film | 22.0 |
| Total Metallic | 38.3 |

Tables 15 and 16 show the resulting color and optical properties, respectively, for the sample of Table 14.

TABLE 15

| Sample | Angle | Rg a* | Rg b* | Rg L* | Rf a* | Rf b* | Rf L* | Rf 400 | Rf 700 |
|---|---|---|---|---|---|---|---|---|---|
| 14 | 8° | −0.13 | −3.57 | 34.37 | −0.88 | −0.84 | 33.93 | 6.24 | 6.56 |
| | 45° | −0.32 | −1.72 | 36.36 | −0.68 | 0.45 | 36.11 | — | — |
| | 60° | 0.15 | −0.82 | 44.70 | −0.03 | 0.46 | 44.58 | 10.46 | 17.42 |

TABLE 16

| Sample | LTA | T a* | T b* | T L* | T solar | R1 solar | R2 solar | Resistance (Ω/□) | Solar Factor (TTs) |
|---|---|---|---|---|---|---|---|---|---|
| 14 | 72.36 | −3.00 | 4.66 | 88.13 | 36.08 | 32.22 | 35.67 | 0.86 | 0.42 |

Quadruple metal coatings on glass substrates are more conductive (0.86Ω/□ sheet resistance) than any of the triple metal coating examples 1-4 (1.3-1.4Ω/□ sheet resistance). Thus, the solar performance and low energy property of the quadruple metal coating is greater than the triple metal coatings. Tint glass is not needed when forming quadruple metal coatings.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

The invention claimed is:

1. A coated article comprising:
   a first substrate comprising a first surface and second surface opposite the first surface;
   a second substrate comprising a third surface and a fourth surface opposite the third surface, wherein the third surface faces the second surface;
   an interlayer positioned between the first substrate and the second substrate;
   a functional coating applied over the second surface of the first substrate or the third surface of the second substrate, the functional coating comprising:
      a first dielectric layer over at least a portion of the surface, wherein the first dielectric layer comprises a first film over at least a portion of the surface and a second film over at least a portion of the first film;
a first continuous metallic layer over at least a portion of the first dielectric layer;
a second dielectric layer over at least a portion of the first metallic layer, wherein the second dielectric layer comprises a first film over at least a portion of the first metallic layer, a second film over at least a portion of the first film, and a third film over at least a portion of the second film;
a second continuous metallic layer over at least a portion of the second dielectric layer;
a third dielectric layer over at least a portion of the second metallic layer, wherein the third dielectric layer comprises a first film over at least a portion of the second metallic layer, a second film over at least a portion of the first film, and a third film over at least a portion of the second film;
a third continuous metallic layer over at least a portion of the third dielectric layer;
a fourth dielectric layer over at least a portion of the third metallic layer, wherein the fourth dielectric layer comprises a first film over at least a portion of the third metallic layer and a second film positioned over at least a portion of the first film, wherein the fourth dielectric layer comprises a total thickness of 10 nanometers to 50 nanometers; and
a continuous light absorbing layer formed over and in direct contact with at least a portion of the fourth dielectric layer, wherein the light absorbing layer is selected from the group consisting of Ge, $GeO_x$, $NbN_x$, $NbN_xO_y$, $Si_aCo_b$, $Si_aCO_bO_x$, $Si_aCo_bCu_c$, $Si_aCo_bCu_cO_x$, $Si_aCr_b$, $Si_aCr_bO_x$, $Si_aNi_b$, $SiNiO_x$, $SnN_x$, $SnO_x$, $SnO_xN_y$, $TiN_x$, $Ti_aNb_bN_x$, $Ti_aNb_bO_x$, $Ti_aNb_bO_xN_y$, $TiO_xN_y$, $WO_x$, $WO_2$, or any combination thereof,
wherein the light absorbing layer is the outmost layer of the functional coating; and
an outermost protective coating comprising a protective layer positioned over at least a portion of the functional coating, wherein the continuous light absorbing layer is positioned between the fourth dielectric layer and the outermost protective coating,
wherein a total combined thickness of the three metallic layers is at least 25 nanometers, and no more than 31 nanometers; and
wherein the coated article has a visible light transmittance of at least 70%.

2. The coated article of claim 1, wherein the coated article has a visible light reflectance of not more than 8%.

3. The coated article of claim 1, wherein at least one of the metallic layers comprises at least one of silver or gold.

4. The coated article of claim 1, further comprising at least one primer layer formed over at least one of the metallic layers,
wherein the at least one primer layer is selected from the group consisting of zinc, aluminum, vanadium, tungsten, tantalum, niobium, zirconium, manganese, chromium, tin, nickel, germanium, magnesium, molybdenum, silver, silicon carbon, aluminum zinc, vanadium zinc, tungsten tantalum, titanium niobium, zirconium niobium, tungsten niobium, aluminum niobium, aluminum titanium, tungsten titanium, tantalum titanium, zinc titanium, aluminum silver, zinc tin, indium zinc, silver zinc, mixtures thereof, combinations thereof, or any alloys thereof, and wherein the primer is deposited as a metal and subsequently oxidized.

5. The coated article of claim 1, wherein at least one of the dielectric layers comprise zinc stannate, zinc oxide, silicon nitride, aluminum-doped zinc oxide, gallium-doped zinc oxide, indium-doped zinc oxide, magnesium-doped zinc oxide, or indium-doped tin oxide.

6. The coated article of claim 1, wherein the protective layer comprises at least one of titania, alumina, or combinations thereof.

7. The coated article of claim 1, wherein the light absorbing layer is selected from the group consisting of $Si_aCO_bO_x$, $TiN_x$, $WO_x$, $WO_2$, or any combination thereof.

8. The coated article of claim 1, wherein the coated article has an Rf and an Rg of not greater than 8%.

9. The coated article of claim 1, wherein outermost protective coating comprises a first protective film and a second protective film over at least a portion of the first protective film.

10. The coated article of claim 9, wherein the first protective film is selected from the group consisting of titania, alumina, and combinations thereof, and
wherein the second protective film is selected from the group consisting of titania, alumina, and combinations thereof.

11. A method of making a coated article comprising:
providing a first substrate comprising a first surface and second surface opposite the first surface;
applying a functional coating over at least a portion of the second surface of the first substrate, the applying the functional coating step comprising:
forming a first dielectric layer over at least a portion of the second surface of the first substrate, wherein the first dielectric layer comprises a first film over at least a portion of the surface and a second film over at least a portion of the first film;
forming a first continuous metallic layer over at least a portion of the first dielectric layer;
forming a second dielectric layer over at least a portion of the first metallic layer, wherein the second dielectric layer comprises a first film over at least a portion of the first metallic layer, a second film over at least a portion of the first film, and a third film over at least a portion of the second film;
forming a second continuous metallic layer over at least a portion of the second dielectric layer;
forming a third dielectric layer over at least a portion of the second metallic layer, wherein the third dielectric layer comprises a first film over at least a portion of the second metallic layer, a second film over at least a portion of the first film, and a third film over at least a portion of the second film;
forming a third continuous metallic layer over at least a portion of the third dielectric layer;
forming a fourth dielectric layer over at least a portion of the third metallic layer, wherein the fourth dielectric layer comprises a first film over at least a portion of the third metallic layer and a second film over at least a portion of the first film, wherein the fourth dielectric layer comprises a total thickness of 10 nanometers to 50 nanometers; and
forming a continuous light absorbing layer over and in direct contact with at least a portion of the fourth dielectric layer, wherein the light absorbing layer is selected from the group consisting of Ge, $GeO_x$, $NbN_x$, $NbN_xO_y$, $Si_aCo_b$, $Si_aCO_b$, $Si_aCo_bCu_c$, $Si_aCo_bCu_cO_x$, $Si_aCr_b$, $Si_aCr_bO_x$, $Si_aNi_b$, $SiNiO_x$, $SnN_x$, $SnO_x$, $SnO_xN_y$, $TiN_x$, $Ti_aNb_bN_x$, $Ti_aNb_bO_x$, $Ti_aNb_bO_xN_y$, $TiO_xN_y$, $WO_x$, $WO_2$, or any combination thereof, wherein the light absorbing layer is the outmost layer of the functional coating; and applying an outermost protective coating comprising a protective layer over at least a portion of the functional coating, wherein the continuous light absorbing layer is positioned between the fourth dielectric layer and the outermost protective coating; and positioning an interlayer over and in contact with the second surface of the first substrate, positioning a second substrate over the interlayer, wherein the second substrate has a third surface over and in contact with the interlayer and a fourth surface, wherein a total combined thickness of the three metallic layers is at least 25 nanometers, and no more than 31 nanometers; and wherein the coated article has a visible light transmittance of at least 70%.

12. The method of claim 11, wherein the light absorbing layer is selected from the group consisting of $Si_aCo_bO_x$, $TiN_x$, $WO_x$, $WO_2$, or any combination thereof.

13. The coated article of claim 1, wherein the light absorbing layer comprises silicon cobalt oxide.

14. The coated article of claim 1, wherein the functional coating consists of three metallic layers.

15. The method of claim 11, wherein the functional coating consists of three metallic layers.

16. The method of claim 11, wherein the light absorbing layer comprises silicon cobalt oxide.

17. The method of claim 11, wherein outermost protective coating comprises a first protective film and a second protective film over at least a portion of the first protective film.

18. The method of claim 17, wherein the first protective film is selected from the group consisting of titania, alumina, and combinations thereof, and wherein the second protective film is selected from the group consisting of titania, alumina, and combinations thereof.

* * * * *